US008565022B2

(12) United States Patent
Shin et al.

(10) Patent No.: US 8,565,022 B2
(45) Date of Patent: Oct. 22, 2013

(54) MEMORY SYSTEM AND METHOD OF OPERATING THE SAME

(75) Inventors: Tai Sik Shin, Gyeonggi-do (KR); Duck Ju Kim, Gyeonggi-do (KR); Dong Hyeon Ham, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 180 days.

(21) Appl. No.: 13/178,880

(22) Filed: Jul. 8, 2011

(65) Prior Publication Data

US 2012/0008397 A1    Jan. 12, 2012

(30) Foreign Application Priority Data

Jul. 9, 2010   (KR) .......................... 10-2010-0066519
Dec. 22, 2010  (KR) .......................... 10-2010-0132482

(51) Int. Cl.
G11C 16/04    (2006.01)

(52) U.S. Cl.
USPC ................................ 365/185.03; 365/185.11

(58) Field of Classification Search
USPC ........................................ 365/185.03, 185.11
See application file for complete search history.

(56) References Cited

U.S. PATENT DOCUMENTS

2009/0043951 A1*  2/2009  Shalvi et al. .................. 711/103
2009/0225593 A1*  9/2009  Cha et al. .................. 365/185.03

FOREIGN PATENT DOCUMENTS

KR    1020100070026    6/2010

OTHER PUBLICATIONS

Notice of Preliminary Rejection issued from Korean Intellectual Property Office on Sep. 22, 2011.

* cited by examiner

*Primary Examiner* — Huan Hoang
(74) *Attorney, Agent, or Firm* — IP & T Group LLP

(57) ABSTRACT

A memory system includes a flash memory device including a first memory block group on which a least significant bit (LSB) program operation has been performed and a program operation on another bit has not been performed and a second memory block group on which both the LSB program operation and a most significant bit (MSB) program operation have been performed and a memory controller configured to check which of the first and second memory block groups a memory block selected for an LSB data read operation belongs to and set a level of a read voltage for the LSB data read operation of the selected memory block.

25 Claims, 18 Drawing Sheets

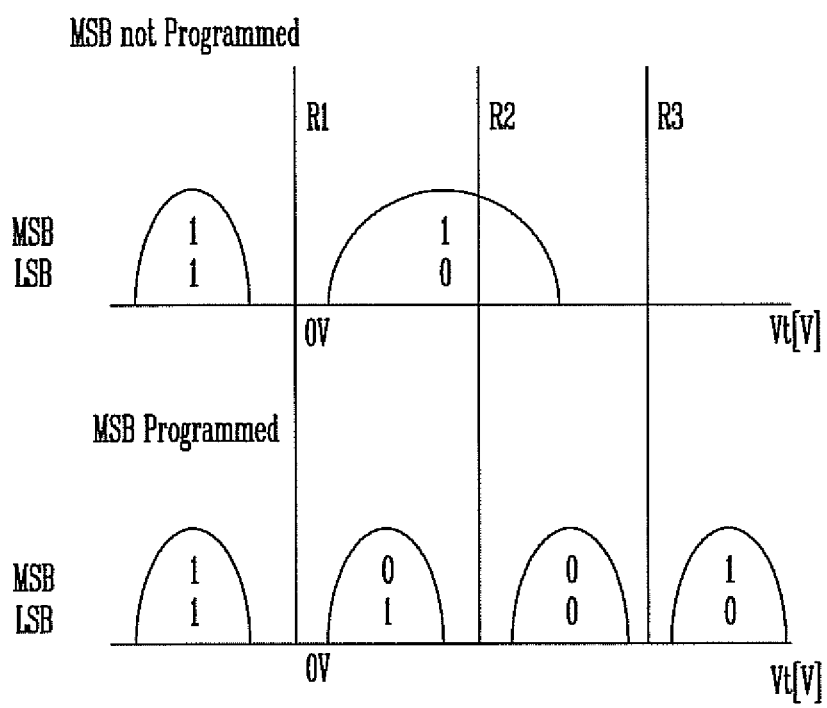

MEMORY SYSTEM AND METHOD OF OPERATING THE SAME

CROSS-REFERENCES TO RELATED APPLICATION

Priority to Korean patent application numbers 10-2010-0066519 filed on Jul. 9, 2010 and 10-2010-0132482 filed on Dec. 22, 2010 the entire disclosures of which are incorporated by reference herein.

BACKGROUND

Exemplary embodiments relate to a memory system and a method of operating the same and, more particularly, to a memory system including a nonvolatile memory device and a method of operating the same.

In a nonvolatile memory device such as a NAND flash memory device, data stored in memory cells may be classified based on levels in which threshold voltages of the memory cells are distributed. For example, when storing 2-bit data in one memory cell, threshold voltages of the memory cells may be distributed on the basis of 4 ($2^2$) different levels. Furthermore, when storing 1-bit data in one memory cell, threshold voltages of the memory cells may be distributed into 2 ($2^1$) levels.

The memory cell array of the NAND flash memory device includes a plurality of memory blocks. While 1-bit data is stored in some of the memory blocks in order to increase the operating speed, 2-bit data may be stored in the remaining memory blocks in order to increase the data storage capacity. In the case where 1-bit data is stored in one memory cell, only one kind of program operation for raising the threshold voltages of selected memory cells based on data to be stored in the memory cells is to be performed. In order to store 2-bit data in one memory cell, however, a least significant bit (hereinafter referred to as an 'LSB') program operation for storing LSB data and a most significant bit (hereinafter referred to as an 'MSB') program operation for storing MSB data are to be performed. Threshold voltage distributions of memory cells differ for each case (i.e., when 1-bit data is stored and when 2-bit data is stored).

FIG. 1 is a diagram illustrating threshold voltage distributions of memory cells.

Referring to FIG. 1, in the case where 1-bit data is stored in a memory cell, only an LSB program operation may be performed without a MSB program operation. At this time, MSB data of the memory cell is set to '1' in order for the operation of the memory cell to match with the operation of another memory cell in which the MSB data is stored. Accordingly, through the program operation, only the 1-bit data may be stored in the memory cell as LSB data. Since only the 1-bit data is stored in the memory cell, threshold voltages of such memory cells are divided into a level (that is, an erase level) lower than 0 V and a level higher than 0 V. Furthermore, levels of the threshold voltages are determined based on the LSB data (1, 0) of one stored bit.

Meanwhile, in the case where 2-bit data is stored in a memory cell, an LSB program operation and an MSB program operation are sequentially performed. That is, 2-bit data, including LSB data and MSB data, is stored in one memory cell. Since the 2-bit data is stored in the memory cell, threshold voltages of such memory cells are classified into a level (that is, an erase level) lower than 0 V and first to third program levels higher than 0 V. Furthermore, levels of the threshold voltages are determined based on the data of stored 2 bits (11, 01, 00, and 10).

In the case where only 1-bit data is stored in a memory cell, it does not matter if a threshold voltage distribution is wide, because there is only one threshold voltage distribution higher than 0 V. However, in the case where 2-bit data is stored in a memory cell, a threshold voltage distribution is to be narrow because there are three threshold voltage distributions higher than 0 V.

Furthermore, when an LSB data read operation is performed, a read voltage R1 or R2, which is supplied to a selected word line in order to output the LSB data stored in the memory cells, is to be differently set based on the number of bits of data stored in the memory cells. The details thereof are described as follows.

FIGS. 2A and 2B are diagrams illustrating a method of operating a semiconductor memory device.

Referring to FIGS. 1 and 2A, at step S212, a first read voltage R1 is supplied to a selected word line in order to output LSB data stored in memory cells. Not only the memory cells for storing the data, but also a flag cell for storing state information about the memory cells is coupled to the selected word line. For example, information about whether an MSB program operation for the memory cells has been performed is stored in the flag cell. In general, if data '1' is stored in the flag cell and threshold voltages of the memory cells are lower than 0 V, it means that the MSB program operation has not been performed and only 1-bit data is stored in the memory cells. If data '0' is stored in the flag cell and threshold voltages of the memory cells are higher than 0 V, it means that the MSB program operation has been performed and 2-bit data is stored in the memory cells. When the first read voltage R1 is supplied to the selected word line, data stored in the memory cells and data stored in the flag cell are outputted at the same time.

At step S214, it is determined whether the MSB program operation for the memory cells has been performed based on the data stored in the flag cell.

If, as a result of the determination, the data '1' is stored in the flag cell, the MSB program operation for the memory cells is determined not to have been performed. In this case, since 1-bit data is stored in each of the memory cells, the data stored in the memory cells can be classified into '1' and '0' using the first read voltage R1 as in FIG. 1. The data outputted from the memory cells is externally outputted.

If, as a result of the determination, the data '0' is stored in the flag cell, the MSB program operation for the memory cells is determined to have been performed. In this case, LSB data stored in the memory cells cannot be classified into '1' and '0' using the first read voltage R1. Accordingly, at step S216, the data stored in the memory cells is outputted by supplying the second read voltage R2 to the selected word line. If threshold voltages of the memory cells are lower than the second read voltage R2, data '1' is outputted, and if threshold voltages of the memory cells are higher than the second read voltage R2, data '0' is outputted FIG. 2B shows an example in which the second read voltage R2 is supplied earlier than the first read voltage R1. If the second read voltage R2 is first supplied, LSB data of memory cells on which an MSB program operation has not been performed cannot be accurately outputted. For this reason, the data stored in the memory cells is to be outputted by supplying the first read voltage R1 to the selected word line at step S226.

As described above, both the first and the second read voltages may be used in order to output LSB data based on the number of bits of data stored in memory cells or whether an MSB program operation has been performed. In this case, the operating speed may be lowered.

BRIEF SUMMARY

Exemplary embodiments relate to a memory system and a method of operating the same which are capable of increasing the operating speed.

A memory system according to an aspect of the present disclosure includes a flash memory device including a first memory block group on which a least significant bit (LSB) program operation has been performed and a program operation on another bit has not been performed and a second memory block group on which both the LSB program operation and a most significant bit (MSB) program operation have been performed and a memory controller configured to check which of the first and second memory block groups a memory block selected for an LSB data read operation belongs to and set a level of a read voltage for the LSB data read operation of the selected memory block.

A method of operating a memory system according to another aspect of the present disclosure includes storing memory state information for checking a first memory block group on which a least significant bit (LSB) program operation has been performed and a program operation on another bit has not been performed and a second memory block group on which both the LSB program operation and a most significant bit (MSB) program operation have been performed in a register, checking whether a memory block selected based on an address signal belong to the first memory block group or the second memory block group based on the memory state information in response to an LSB read command signal and the address signal, setting a read voltage for an LSB data read operation to a first level and performing the LSB data read operation for the selected memory block using the read voltage of the first level when the selected memory block belongs to the first memory block group, and, setting the read voltage to a second level higher than first level and performing the LSB data read operation for the selected memory block using the read voltage of the second level when the selected memory block belongs to the second memory block group.

A memory system according to yet another aspect of the present disclosure includes a nonvolatile memory device including a first memory cell block group on which a least significant bit (LSB) program operation has been performed and a program operation on another bit has not been performed, a second memory cell block group on which both the LSB program operation and a medium significant bit program operation have been performed, and a third memory cell block group all the LSB program operation, the medium significant bit program operation, and a most significant bit (MSB) program operation have been performed and a memory controller configured to check which of the first to third memory block groups a memory cell block selected based on an address signal belongs to and set levels of read voltages for at least one of an LSB data read operation, a medium significant bit data read operation, and an MSB data read operation of the selected memory cell block in response to a result of the check.

A method of operating a memory system according to further yet another aspect of the present disclosure includes checking which group a memory cell block selected based on an address signal belongs to, among a first memory cell block group on which a least significant bit (LSB) program operation has been performed and a program operation on another bit has not been performed, a second memory cell block group on which the LSB program operation and a medium significant bit program operation have been performed, and a third memory cell block group on which all the LSB program operation, the medium significant bit program operation, and a most significant bit (MSB) program operation have been performed and setting levels of read voltages for at least one of an LSB data read operation, a medium significant bit data read operation, and an MSB data read operation of the selected memory cell block in response to a result of the checking.

BRIEF DESCRIPTION OF THE DRAWINGS

FIG. 1 is a diagram illustrating threshold voltage distributions of memory cells;

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

Figure 2A:
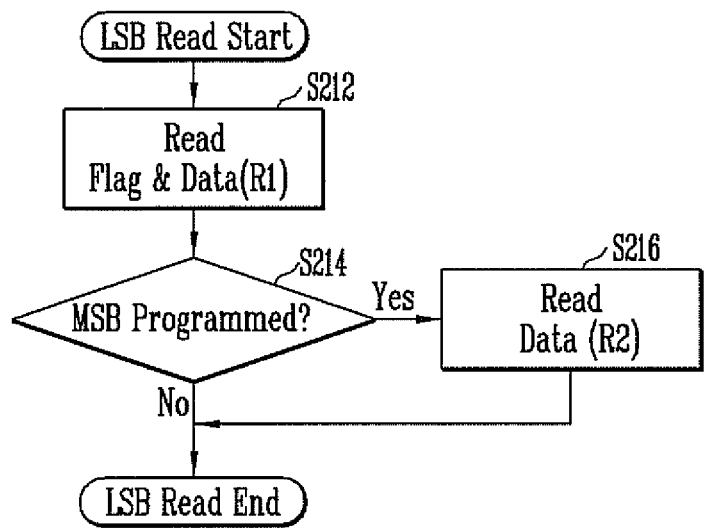
FIGS. 2A and 2B are diagrams illustrating a method of operating a semiconductor memory device.
Figure 2B:
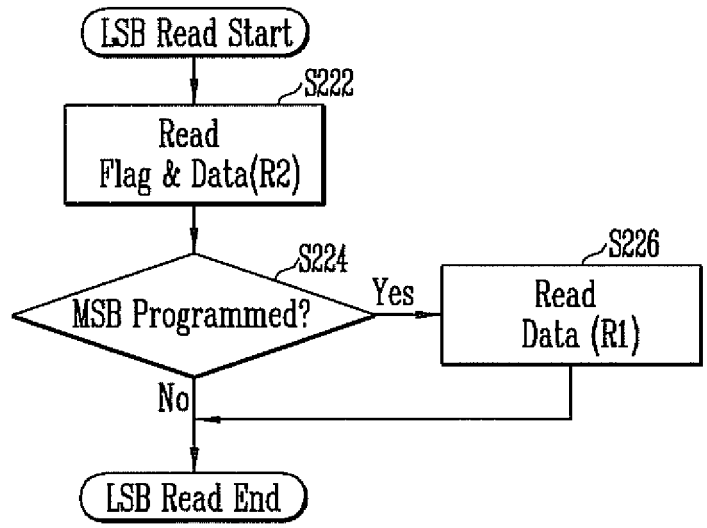
Figure 3:
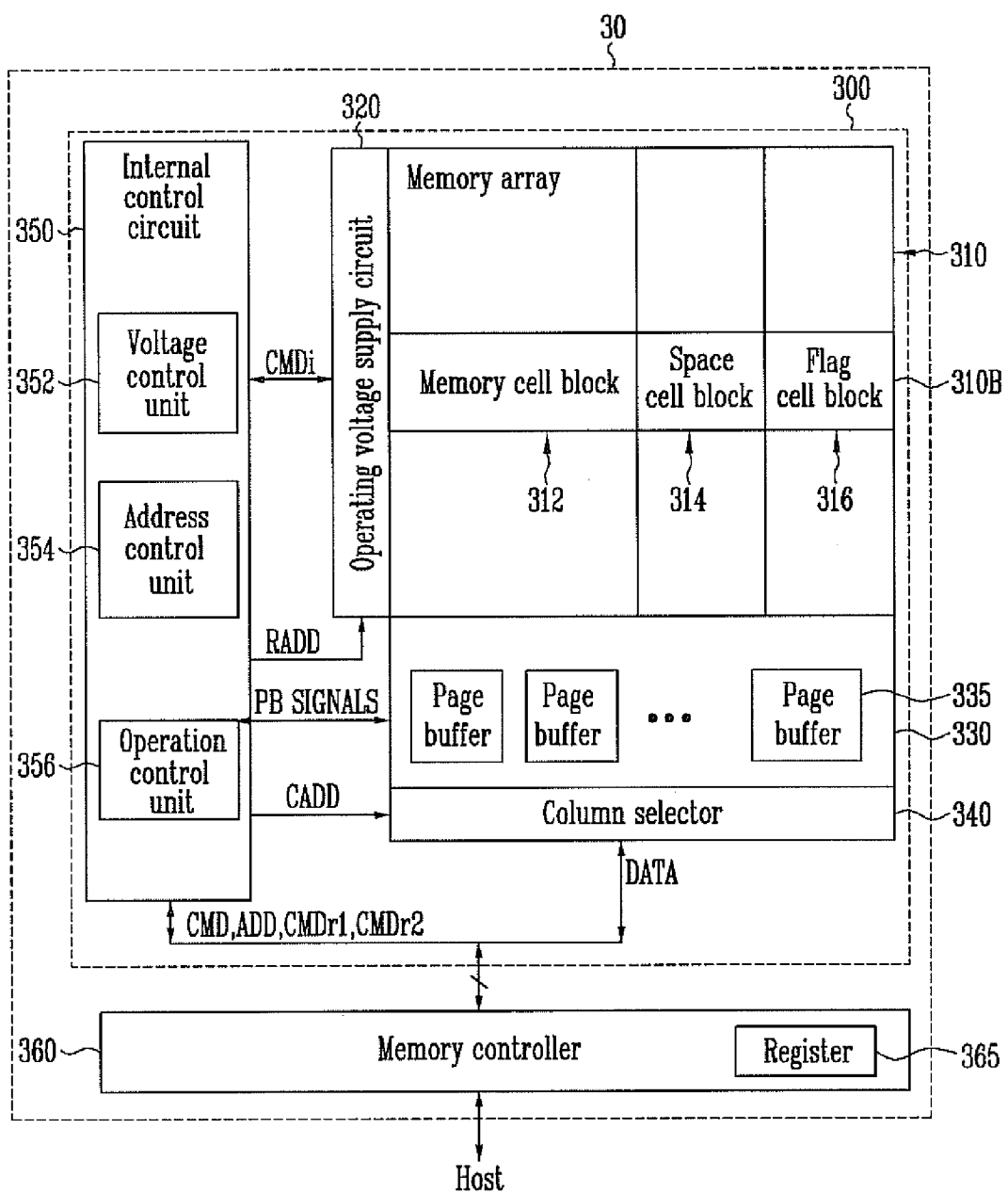
FIG. 3 is a diagram illustrating a memory system according to a first exemplary embodiment of this disclosure.

FIG. 3 is a diagram illustrating a memory system according to a first exemplary embodiment of this disclosure.

Referring to FIG. 3, the memory system 30 includes a flash memory device 300 and a memory controller 360. The flash memory device 300 includes a memory cell array 310, an operating voltage supply circuit 320, a page buffer group 330, a column selector 340, and an internal control circuit 350. The memory controller 360 includes a register 365.

The memory cell array 310 of the flash memory device 300 includes a plurality of memory blocks 310B. Each memory block 310B includes a memory cell block 312, a spare cell block 314, and a flag cell block 316. The detailed configuration of memory cell array 310 is known in the art and omitted for description purposes.

The operating voltage supply circuit 320 supplies operating voltages for the program operation, the read operation, or the erase operation of memory cells to the memory cell array 310. More particularly, the operating voltage supply circuit 320 includes a voltage generator, a row decoder, and a block selector (not shown). The voltage generator generates the operating voltages for the program operation, the read operation, or the erase operation in response to an internal command signal CMDi. The row decoder generates a block select signal for selecting one of the plurality of memory blocks 310B in response to a row address signal RADD. The block selector transfers the operating voltages to the word lines and the select lines of a selected memory block in response to the block select signal.

The page buffer group 330 includes a plurality of page buffers 335. The page buffers 335 sense voltages of bit lines to latch data of the memory cells based on the sensed/detected voltages or store data in memory cells by controlling voltages of bit lines.

The column selector 340 sequentially transfers data DATA to the page buffers 335 in response to a column address signal CADD or outputs the data DATA, latched in the page buffers 335, outside the flash memory device 300.

The internal control circuit 350 includes a voltage control unit 352, an address control unit 354, and an operation control unit 356. The voltage control unit 352 functions to control the operating voltage supply circuit 320 such that the operating voltages for the program operation, the erase operation, or the read operation are generated in response to the internal command signal CMDi. The address control unit 354 functions to generate the row address signal RADD and the column address signal CADD using an address signal ADD. The operation control unit 356 generates page buffer control signals PB SIGNALS for controlling the operation of the page buffers 335 to input and output the data DATA. A detailed function of the operation control unit 356 is described later.

The memory controller 360 is coupled to a host and the flash memory device 300. The memory controller 360 transfers data, read from the flash memory device 300, to the host or stores data, received from the host, in the flash memory device 300. As described above, the memory controller 360 controls the operation of the flash memory device 300 outside the flash memory device 300. The memory controller 360 includes the register 365. When power is supplied to the memory controller 360, the memory controller 360 receives program information about the memory blocks 310B, program information about a page, a read history, a program history, or all of them from the flash memory device 300 and stores them in the register 365. The memory controller 360 will be described in more detail later.

Figure 4:
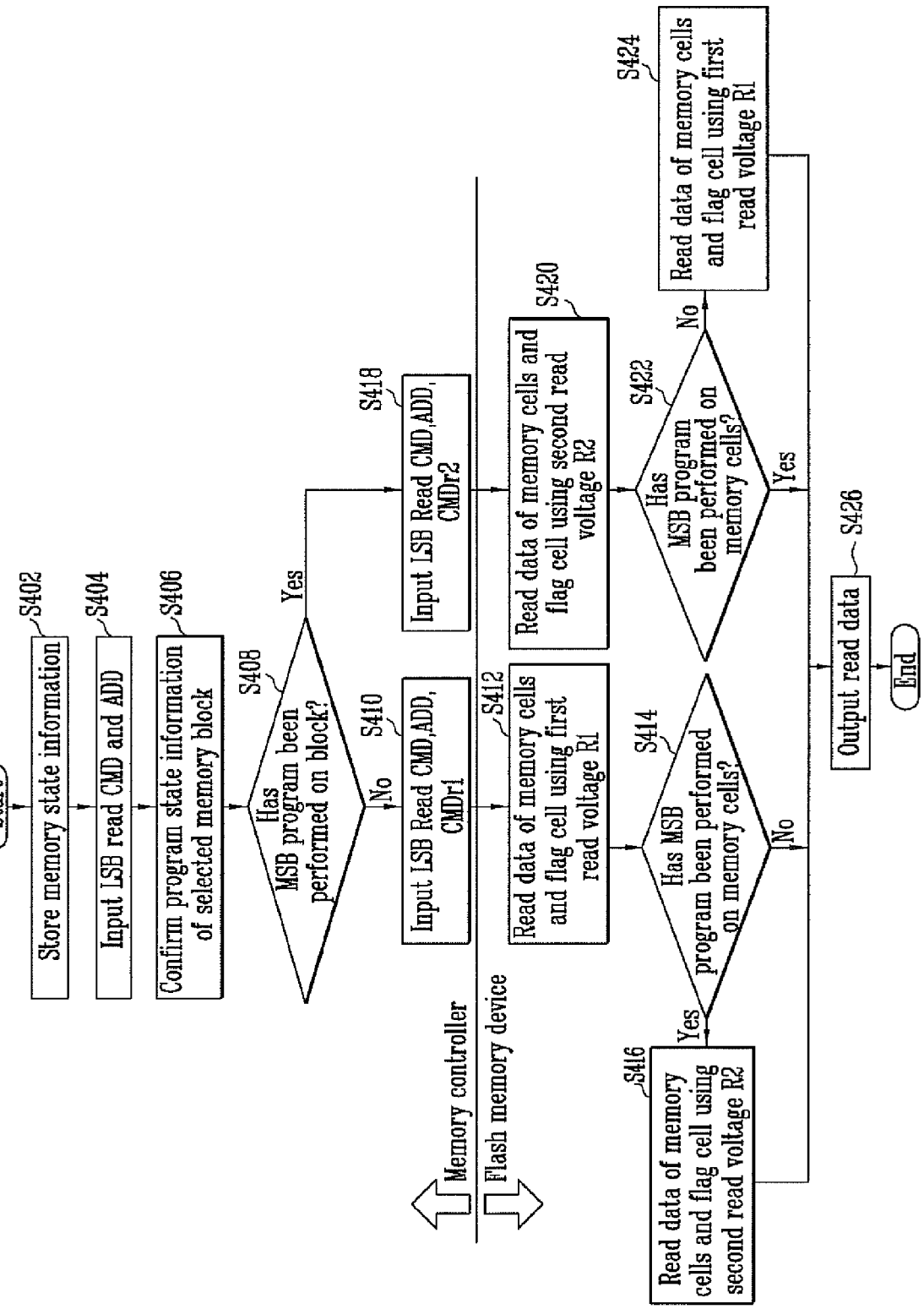
FIGS. 4 and 5 are flowcharts illustrating operations of the memory system according to a first exemplary embodiment of this disclosure.
Figure 5:
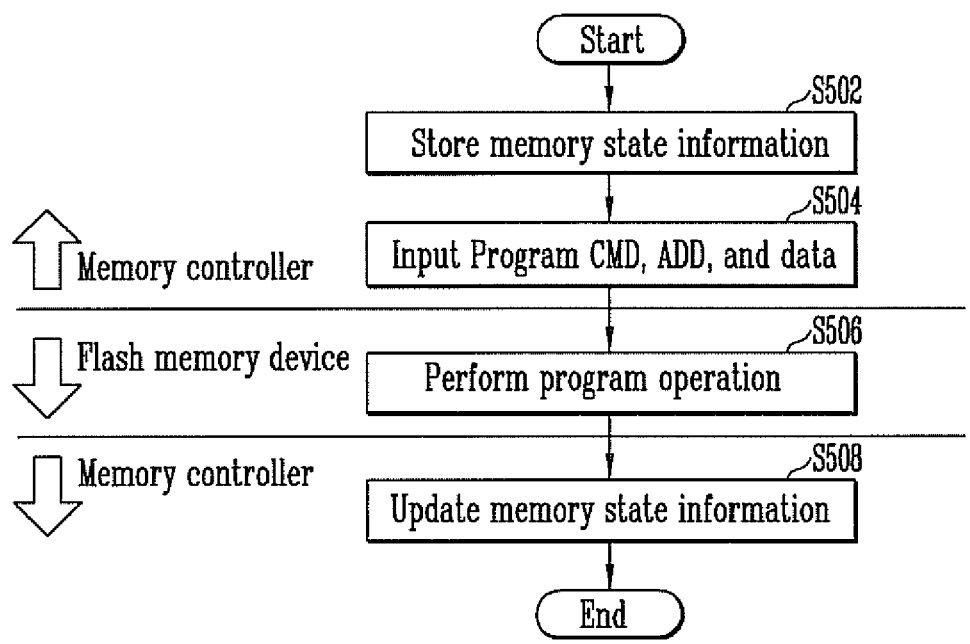

FIGS. 4 and 5 are flowcharts illustrating operations of the memory system 30 according to a first exemplary embodiment of this disclosure.

Referring to FIGS. 3 and 4, at step S402, the memory controller 360 sends, to the flash memory device 300, a signal to request memory state information about the memory blocks 310B of the memory cell array 310. When power is supplied, the memory controller 360 may request the memory state information to the flash memory device 300. The memory controller 360 may request the memory state information to the flash memory device 300 when the flash memory device 300 is in a standby state or an idle state.

The memory cell array 310 of the flash memory device 300 includes a first memory block group on which only an LSB program operation has been performed and a second memory block group on which both an LSB program operation and an MSB program operation have been performed. Accordingly, the flash memory device 300 reads the memory state information, including information about whether the MSB program operation for the memory blocks 310B has been performed, and sends the read memory state information to the memory controller 360, in response to the request signal of the memory controller 360. For example, the internal control circuit 350 may control the operating voltage supply circuit 320, the page buffer group 330, and the column selector 340 so that the memory state information read from the spare cell blocks 314 or the flag cell blocks 316 of the memory blocks 310B is transferred to the memory controller 360. The transmitted memory state information is stored in the register 365 of the memory controller 360.

The memory state information includes information about the first memory block group on which only an LSB program operation has been performed and the second memory block group on which both an LSB program operation and an MSB program operation have been performed. The memory state information may further include information about a memory block in which data is not stored and information about the cumulative number of each of program operations and erase operations for each memory block.

At step S404, an LSB read command and an address signal is transmitted from the host to the memory controller 360.

At step S406, the memory controller 360 searches the register 365 storing the memory state information for checking a program state of a memory block selected based on the address signal.

At step S408, the memory controller 360 determines whether an MSB program operation for the selected memory block (e.g., the memory block 310B) has been performed. That is, the memory controller 360 determines whether 1-bit data or 2-bit data is stored in the memory cells of the memory block 310B. In other words, the memory controller 360 determines whether the memory block 310B selected based on the address signal belongs to the first memory block group or the second memory block group.

If, as a result of the determination, 1-bit data is stored in the memory cells of the memory block 310B through an LSB program operation and thus the memory block 310B belongs to the first memory block group, the memory controller 360 inputs an LSB read command CMD, the address signal ADD, and a first read voltage setting signal CMDr1 to the flash memory device 300 at step S410. Here, the first read voltage setting signal CMDr1 is generated by the memory controller 360 based on the memory state information about the memory block 310B, retrieved from the register 365 in response to the address signal of the memory controller 360.

At step S412, the internal control circuit 350 (in particular, the voltage control unit 352) of the flash memory device 300 controls the operating voltage supply circuit 320 so that a first read voltage (refer to R1 of FIG. 1) is generated. Furthermore, the internal control circuit 350 (in particular, the address control unit 354) generates the row address signal RADD. The operating voltage supply circuit 320 supplies the first read voltage R1 to a selected word line of the memory block 310S in response to the row address signal RADD. Furthermore, the page buffer group 330 latches data read from selected memory cells, spare cells, and flag cells of the memory block 310B.

At step S414, the memory controller 360 determines whether MSB data has been stored in the memory cells of the memory block 310B based on data stored in the flag cells of the memory block 310B, among the data outputted from the page buffer group 330 through the column selector 340. That is, the memory controller 360 determines whether the MSB program operation for the memory cells has been performed.

If, as a result of the determination at step S414, the MSB data is determined not to have been stored in the memory cells of the memory block 310B (that is, only an LSB program operation has been performed on the memory cells), the memory controller 360 outputs the data DATA, outputted through the column selector 330, to the host without change at step S426.

If, as a result of the determination at step S414, the MSB data is determined to have been stored in the memory cells of the memory block 310B, the memory controller 360 or the internal control circuit 350 changes the first read voltage R1 to a second read voltage (refer to R2 of FIG. 1) and performs the read operation again using the second read voltage R2 at step S416.

A probability that the step S416 may be performed is very low because the memory controller 360 stores the memory state information and previously determines whether the MSB program operation for the memory block 310B has been performed. However, if memory state information about a memory block is changed after the memory controller 360 stores the memory state information in the register 365, the changed memory state information may not be identical with the stored memory state information. Accordingly, in order to increase the accuracy of the operation, whether the MSB program operation has been performed may be determined again using the data of the flag cells and the read operation using the second read voltage R2 may be performed.

Meanwhile, if, at step S408, 2-bit data is stored in the memory cells of the memory block 310B according to the MSB program operation and thus the memory block 310B belongs to the second memory block group, the memory controller 360 inputs an LSB read command CMD, an address signal ADD, and a second read voltage setting signal CMDr2 to the flash memory device 300 at step S418. Here, the second read voltage setting signal CMDr2 is generated by the memory controller 360 based on the memory state information of the memory block 310B, retrieved from the register 365 in response to the address signal of the memory controller 360.

At step S420, the internal control circuit 350 (in particular, the voltage control unit 352) of the flash memory device 300 controls the operating voltage supply circuit 320 so that a second read voltage (refer to R2 of FIG. 1) is generated. Furthermore, the internal control circuit 350 (in particular, the address control unit 354) generates the row address signal RADD. The operating voltage supply circuit 320 supplies the second read voltage R2 to a selected word line of the memory block 310B in response to the row address signal RADD. Furthermore, the page buffer group 330 latches data read from the selected memory cells, spare cells, and flag cells of the memory block 310B.

At step S422, the memory controller 360 determines whether only LSB data is stored in the memory cells based on the data of the flag cells, among the data outputted from the page buffer group 330 through the column selector 340. That is, the memory controller 360 determines whether an MSB program operation for the memory cells has been performed.

If, as a result of the determination, the MSB program operation for the memory cells is determined to have been performed, the memory controller 360 outputs the data DATA, outputted through the column selector 330, to the host without change at step S426.

If, as a result of the determination, the MSB program operation for the memory block 310B is determined not to have been performed, but only an LSB program operation is determined to have been performed, the memory controller 360 or the internal control circuit 350 changes the second read voltage R2 to a first read voltage (refer to R1 of FIG. 1) and performs the read operation using the first read voltage R1 again at step S424.

Likewise, a probability that the step S424 may be performed is very low because the memory controller 360 stores the memory state information and previously determines whether the MSB program operation for the memory block 310B has been performed. However, if memory state information about the memory block 310B is changed after the memory controller 360 stores the memory state information in the register 365, the changed memory state information may not be identical with the stored state information. Accordingly, in order to increase the accuracy of the operation, whether the MSB program operation has been performed may be determined again using the data of the flag cells and the read operation using the first read voltage R1 may be performed.

As described above, the memory controller 360 determines whether an MSB program operation for the memory block 310B selected based on the address signal has been performed based on memory state information stored in the flash memory device 300 and determines a level of a read voltage used in an LSB data read operation. Accordingly, LSB data can be accurately read by one LSB data read operation, irrespective of whether an MSB program operation for a memory block has been performed.

An example in which whether the MSB program operation has been performed for each memory block is determined has been described above. However, whether the MSB program operation has been performed for each page may be determined. In other words, since whether an MSB program operation for selected memory cells has been performed is determined irrespective of the block unit or the page unit, a level of a read voltage to be supplied during an LSB data read operation can be determined and LSB data can be outputted by one LSB data read operation.

Meanwhile, the memory state information stored in the register 365 of the memory controller 360 is to be changed based on an operation of the flash memory device 300.

Referring to FIGS. 1 and 5, as described above at step S402 of FIG. 4, memory state information is stored in the register 365 of the memory controller 360 at step S502.

At step S504, the memory controller 360 outputs a program command signal, an address signal, and data to the flash memory device 300 at the request of the host, so that the flash memory device 300 performs a program operation.

At step S506, the flash memory device 300 performs the program operation for a selected memory block (for example, 310B) in response to the program command signal, the address signal, and data received from the memory controller 360. At this time, only an LSB program operation may be performed on the memory cells of the memory block 310B and thus 1-bit data may be stored in the memory cells, or both an LSB program operation and an MSB program operation may be performed on the memory cells of the memory block 310B and thus 2-bit data may be stored in the memory cells. If the MSB program operation is performed, data for checking whether the MSB program operation has been performed is stored in the flag cells of the flag cell block 316 of the memory block 310B.

After the program operation of the flash memory device 300 is completed, the memory controller 360 checks which group the memory block 310B belongs to among a first memory block group on which only the LSB program operation has been performed and a second memory block group on which both the LSB program operation and the MSB program operation have been performed. The memory controller 360 updates the memory state information, stored in the register 365, based on a result of the determination at step S508.

The updated memory state information may be used at step S406 of FIG. 4. Thus, even if a program operation for memory blocks is performed after the memory state information is stored in the register 365 of the memory controller 360, a read voltage can be accurately set to a first level or a second level in the read operation described with reference to FIG. 4 because the memory state information is updated after the program operation.

Figure 6:
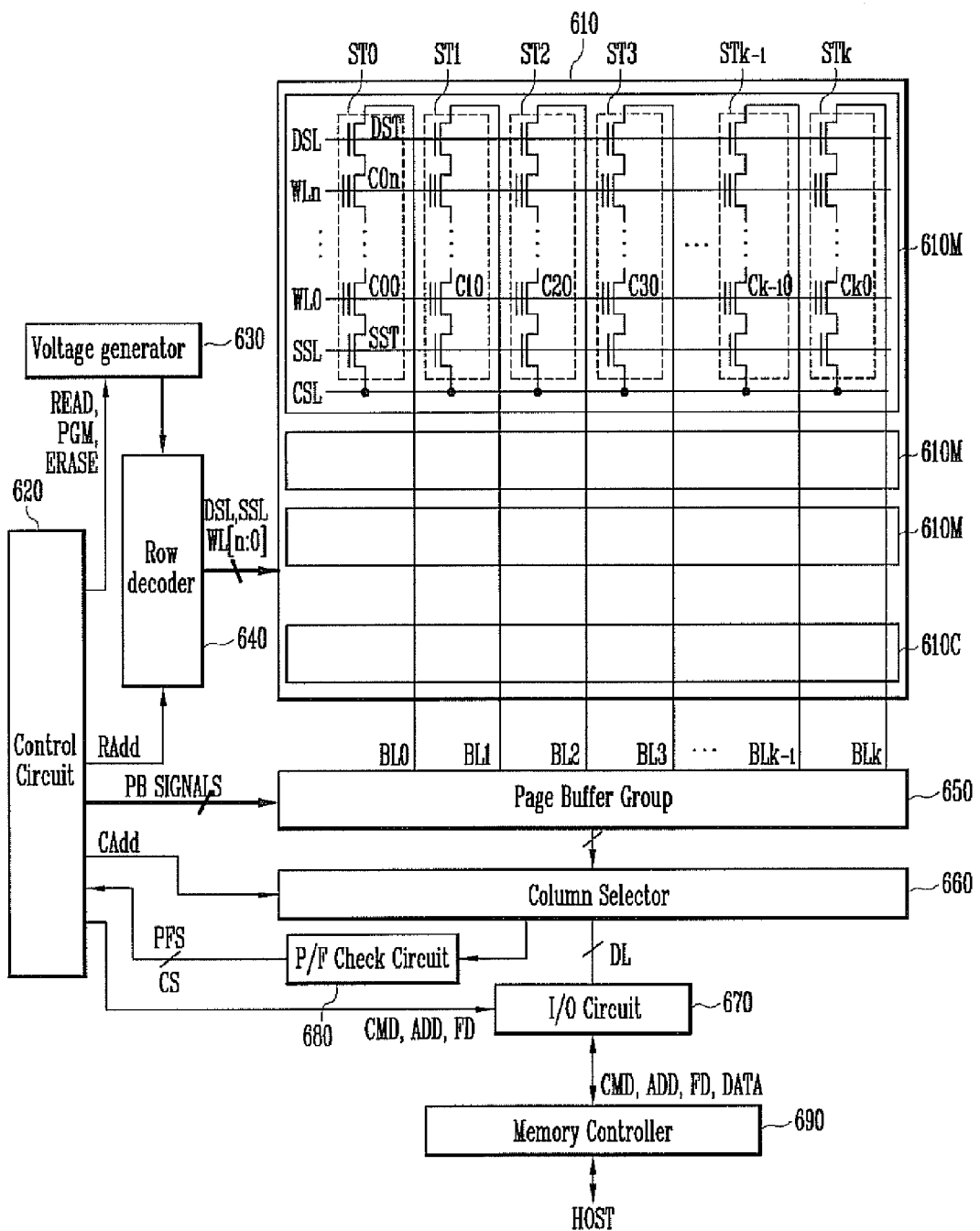
FIG. 6 is a block diagram illustrating the configuration of a memory system according to a second exemplary embodiment of this disclosure.

FIG. 6 is a block diagram illustrating the configuration of a memory system according to a second exemplary embodiment of this disclosure.

Referring to FIG. 6, the memory system according to the second exemplary embodiment of this disclosure includes a nonvolatile memory device and a memory controller 690 for controlling the nonvolatile memory device. The nonvolatile memory device includes a memory cell array 610, an operation circuit group (630, 640, 650, 660, 670, and 680) configured to perform program and read operations for the memory cells of the memory cell array 610, and a control circuit 620 configured to control the operation circuit group (630, 640, 650, 660, 670, and 680).

In a nonvolatile memory device such as a NAND flash memory device, the operation circuit group includes a voltage generator 630, a row decoder 640, a page buffer group 650, a column selector 660, and an I/O circuit 670, and a pass/fail (P/F) check circuit 680.

The memory cell array 610 may include a plurality of memory cell blocks 610M and a CAM block 610C for storing information about the memory cell blocks 610M. Each memory cell block 610M includes a plurality of strings ST0 to STk. Each string (for example, ST1) includes a source select transistor SST coupled to a common source line CSL, a plurality of memory cells C00 to C0n, and a drain select transistor DST coupled to a bit line BL0. The gate of the source select transistor SST is coupled to a source select line SSL. The gates of the memory cells C00 to C0n are coupled to respective word lines WL0 to WLn. The gate of the drain select transistor DST is coupled to a drain select line DSL. The strings ST0 to STk are coupled to the respective bit lines BL0 to BLk and are commonly coupled to the common source line CSL. The CAM block 610C stores the information about the memory cell blocks 610M (in particular, the information about the number of bits of data stored in the memory cells of the memory cell blocks 610M). The CAM block 610C may further store a mapping table, including information about which data is stored in the memory cell blocks 610M.

The control circuit 620 internally generates a program operation signal PGM, a read operation signal READ, or an erase operation signal ERASE in response to a command signal CMD received from the memory controller 690 and generates control signals PB SIGNALS for controlling the page buffers (not shown) of the page buffer group 650 according to a type of the operation. Furthermore, the control circuit 620 internally generates a row address signal RAdd and a column address signal CAdd in response to an address signal ADD. In this disclosure, the control circuit 620 controls the operation circuit group (630, 640, 650, 660, 670, and 680) such that a program operation, a program verification operation, an erase operation, and an erase verification operation can be performed. In particular, the control circuit 620 controls the operation circuit group (630, 640, 650, 660, 670, and 680) so that a read operation for the memory cells can be performed based on flag data FD received from the memory controller 690.

The voltage supply circuit (630, 640) supplies operating voltages used for the program operation, the erase operation, or the read operation for the memory cells of a selected memory cell block (for example, 610M) to the drain select line DSL, the word lines WL0 to WLn, and the source select line SSL of the memory cell block 610M in response to the signals READ, PGM, ERASE, and RAdd of the control circuit 620. The voltage supply circuit includes the voltage generator 630 and the row decoder 640.

The voltage generator 630 outputs the operating voltages for reading data stored in the memory cells to global lines in response to the operation signals PGM, READ, and ERASE (that is, the internal command signals) of the control circuit 620.

The row decoder 640 transfers the operating voltages of the voltage generator 630 to the strings ST1 to STk of the selected memory cell block 610M of the memory cell array 610 in response to the row address signals RAdd of the control circuit 620.

The page buffer group 650 includes the page buffers (not shown) coupled to the respective bit lines BL0 to BLk. The page buffer group 650 supplies voltages used to store data in the memory cells C00 to Ck0 to the respective bit lines BL0 to BLk in response to the control signals PB SIGNALS of the control circuit 620. Each page buffer includes a main latch and a cache latch. When data stored in memory cells is read by the main latch, the read data can be externally outputted through the cache latch.

The column selector 660 selects the page buffers of the page buffer group 650 in response to the column address signal CAdd of the control circuit 620. Data stored in the page buffers selected by the column selector 660 is outputted.

The I/O circuit 670 transfers externally inputted data to the column selector 660 under the control of the control circuit 620 so that the externally inputted data is inputted to the page buffer group 650 when a program operation is performed.

The P/F check circuit 680 checks whether an error cell having a threshold voltage lower than a target voltage, among programmed memory cells, exists in a program verification operation performed after a program operation and outputs a result of the check as a check signal PFS. Furthermore, the P/F check circuit 680 counts the number of error cells and outputs a result of the count as a count signal CS.

The memory controller 690 outputs the command signal CMD and the address signal ADD to a relevant nonvolatile memory device at the request of a host and may further output data DATA to the nonvolatile memory device during a program operation. In particular, the memory controller 690 inputs the flag data FD indicating whether a LSB program operation or an MSB program operation has been performed according to a multi-level cell (hereinafter referred to as an 'MLC') program method or a triple level cell (hereinafter referred to as an 'TLC') program method. When power starts being supplied to the nonvolatile memory device, the memory controller 690 stores memory block information (for example, the mapping table) received from the CAM block 610C of the nonvolatile memory device.

The memory block information includes information about the address of an error memory block, information about whether data is stored in the memory blocks, and program state information about the memory blocks. Here, the number of bits of data stored in relevant memory cells and the number of levels of threshold voltage distributions of the memory cells can be checked based on the program state information. The memory controller 690 checks the number of bits of data stored in the memory cells of a memory block on which a read operation will be performed based on the program state information and outputs resulting flag data FD to the nonvolatile memory device. That is, the memory controller 690 checks the number of levels in which threshold voltages of the memory cells are distributed based on the program state information and outputs the flag data FD for determining the level of a read voltage, supplied to the memory cells during a read operation, to the nonvolatile memory device based on a result of the check. The control circuit 620 determines whether a LSB program operation or an MSB program operation has been performed based on the flag data FD of the memory controller 690 and controls the operation circuit group so that the read operation is performed based on a result of the determination.

Figure 7A:
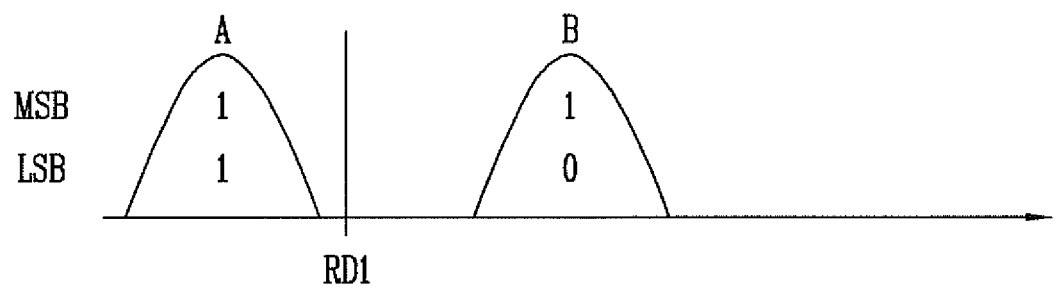
FIGS. 7A to 7C are diagrams illustrating an operation of the memory system using flag data in an MLC program method according to the second exemplary embodiment of this disclosure.
Figure 7B:
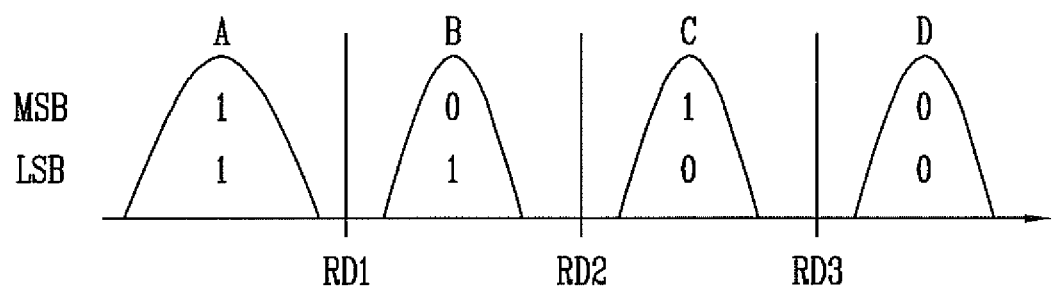
Figure 7C:
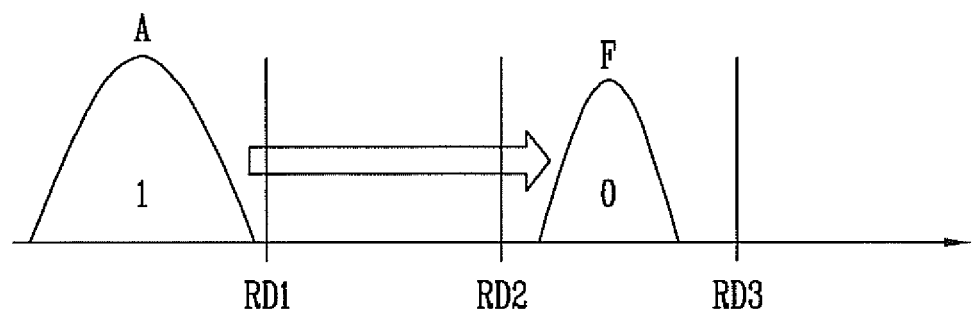

FIGS. 7A to 7C are diagrams illustrating an operation of the memory system using flag data in the MLC program method according to the second exemplary embodiment of this disclosure.

In a 2-bit MLC program method of storing 2-bit data in one memory cell, an LSB program is first performed and an MSB program is then performed. Here, in order to check whether only the LSB program operation has been performed and both the LSB program operation and the MSB program operation have been performed, a flag cell is provided in a flag cell region and data, indicating whether the MSB program operation has been performed, is stored in the flag cell.

FIG. 7A and FIG. 7B show threshold voltage distributions of memory cells on which an LSB program operation and an MSB program operation together with the LSB program operation have been performed, respectively. FIG. 7C shows threshold voltage distributions of the flag cells before and after an MSB program operation is performed.

Referring to FIG. 7A, after the LSB program operation, the threshold voltages of the memory cells may have two distribution states A and B. Referring to FIG. 7B, after the MSB program operation, the threshold voltages of the memory cells may have four distribution states A, B, C, and D.

Meanwhile, referring to FIG. 7C, the threshold voltage of the flag cell is programmed higher than a second reference voltage RD2 from a level lower than a first reference voltage RD1 after the MSB program operation. Accordingly, whether the MSB program operation has been performed can be determined based on the threshold voltage distribution of the flag cells.

Figure 8A:
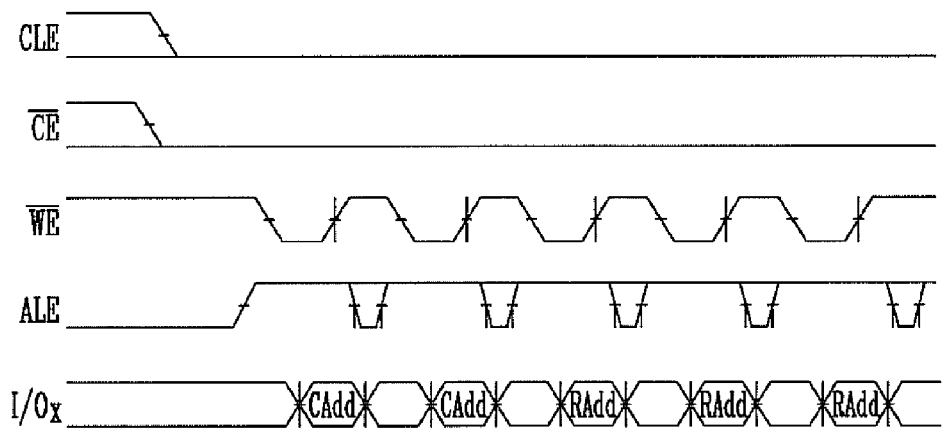
FIG. 8A is a timing diagram illustrating the read operation of the memory system according to a second exemplary embodiment of this disclosure.
Figure 8B:
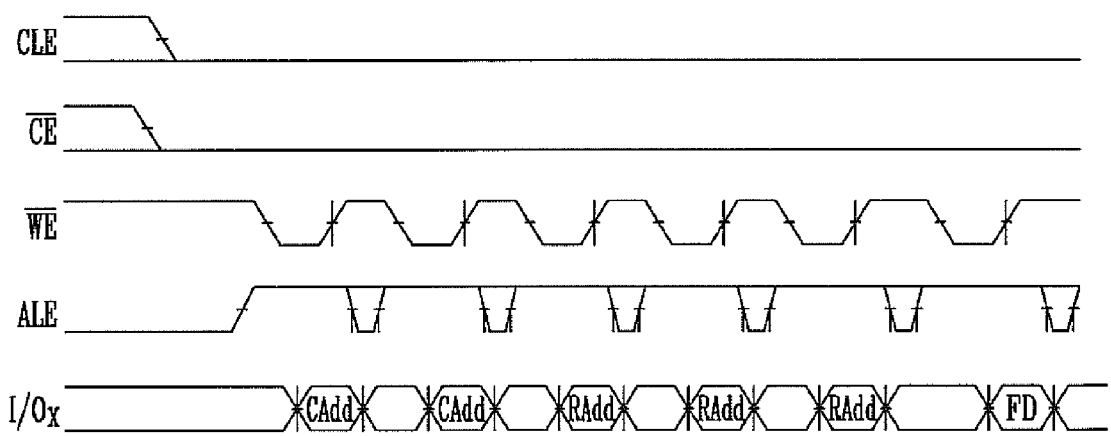
FIG. 8B is a timing diagram illustrating the read operation of the memory system according to a third exemplary embodiment of this disclosure.

FIG. 8A is a timing diagram illustrating the read operation of the memory system according to a second exemplary embodiment of this disclosure, and FIG. 8B is a timing diagram illustrating the read operation of the memory system according to a third exemplary embodiment of this disclosure.

The read operation may be started in response to a read start command (not shown) inputted during a period where a command latch enable signal CLE is activated in the state in which a chip enable signal /CE has been activated.

Referring to FIGS. 8A and 8B, when the read operation is started, the address signal ADD indicating memory cells for the read operation is received through the I/O buffer of the memory system. The address signal ADD may be received over a total of 5 clock cycles during the period in which an address latch enable signal ALE is activated. The address signal ADD may include the column address signal CAdd and the row address signal RAdd of the memory cells storing the data to be read. As described above with reference to FIG. 6, when the address signal ADD is received from the memory controller 690, the control circuit 620 may internally generate the column address signal CAdd and the row address signal RAdd.

The read operation of the memory system shown in FIG. 8B differs from the read operation shown in FIG. 5A in that the flag data FD is further received after a cycle in which the address signal ADD is received. The flag data FD may be received from the memory controller 690 and may be received as flag data corresponding to a specific memory cell block or a specific page. The memory controller 690 checks a program state of a selected page of a memory cell block selected by the address signal based on a mapping table and outputs the flag data FD based on a result of the check. FIG. 8B shows an example in which the flag data FD is received following a cycle in which the address signal is received. However, the flag data FD may be received at empty bits in the middle of the cycle. The read operation varied in response to the input of the flag data FD is described as follows.

Figure 9A:
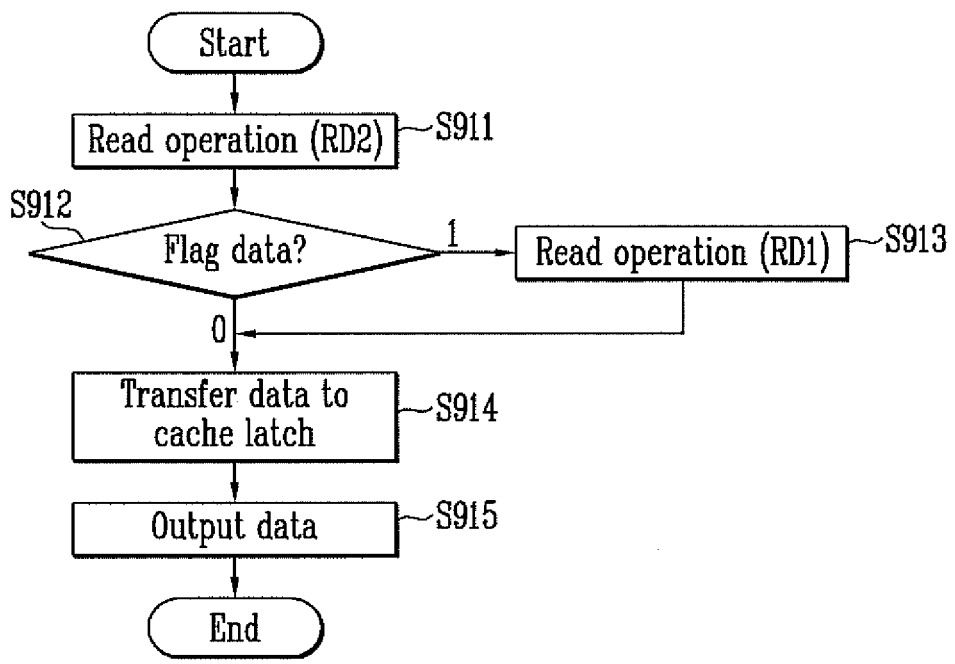
FIGS. 9A and 9C are flowcharts illustrating a read operation for the memory system using an MLC program method according to a second exemplary embodiment of this disclosure.
Figure 9B:
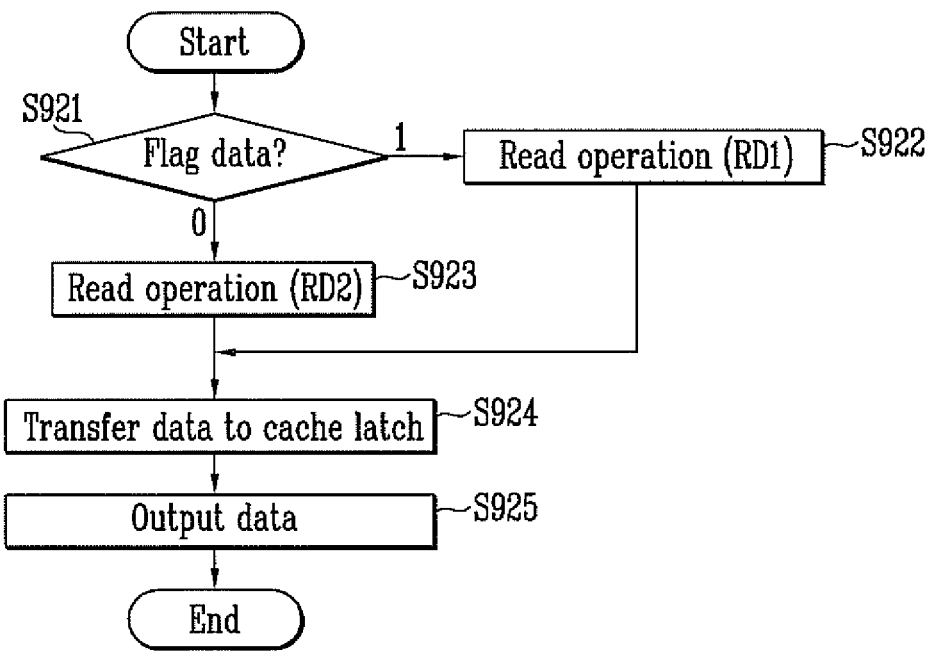
FIGS. 9B and 9D are flowcharts illustrating a read operation for the memory system using an MLC program method according to a third exemplary embodiment of this disclosure.

FIG. 9A is a diagram illustrating an LSB data read operation in the memory system using the MLC program method according to a second exemplary embodiment of this disclosure. FIG. 9B is a diagram illustrating an LSB data read operation in the nonvolatile memory device of the MLC program method according to a third exemplary embodiment of this disclosure.

The LSB data read operation in the memory system using the MLC program method according to the second exemplary embodiment of this disclosure is described with reference to FIGS. 7A to 7C and 9A. First, in order to determine whether an MSB program operation has been performed, flag data stored in the flag cell is read. The flag data is read by using the second reference voltage RD2 as a read voltage at step S911. The read flag data is checked at step S912. Referring to FIG. 7C, if a threshold voltage of the flag cell is higher than the second reference voltage RD2, the flag data is '0'. When the threshold voltage of the flag cell is lower than the second reference voltage RD2, the flag data is '1'.

If, as a result of the check, the flag data is '1', threshold voltage distributions of memory cells to be read have the same state as shown in FIG. 7A. It means that only an LSB program operation is performed and only 1-bit data is stored in the memory cells. In order to determine which one of the two stats A and B the threshold voltages of the memory cells belong to, a read operation is performed on the memory cells by using the first reference voltage RD1 as a read voltage at step S913. If, as a result of the determination, the threshold voltages of the memory cells are lower than the first reference voltage RD1, LSB data to be read is '1' (A state). If, as a result of the determination, the threshold voltages of the memory cells are higher than the first reference voltage RD1, the LSB data is '0' (B state). As described above, the read operation using the first reference voltage RD1 is performed at step S913. Data read by the main latch of a relevant page buffer is transferred to the cache latch of the page buffer at step S914. Next, the read data is outputted at step S915.

If, as a result of the check, the flag data is '0', it means that the MSB program operation is performed and 2-bit data is stored in the memory cells sharing the same word line as the flag cell. That is, threshold voltages of the memory cells have the same state as shown in FIG. 7B. When the threshold voltages of the memory cells are lower than the second reference voltage RD2, LSB data to be read is '1' (A and B states). When the threshold voltages of the memory cells are higher than the second reference voltage RD2, the LSB data is '0' (C and D states). The read operation using the second reference voltage RD2 as a read voltage has already been performed at step S911, and thus whether the LSB data to be read is '0' or '1' is determined based on the reads operation at step S911. If, as a result of the check, the flag data is '0', data read by the main latch of a relevant page buffer is transferred to the cache latch of the page buffer at step S914 and then externally outputted at step S915.

The LSB data read operation in the memory system using the MLC program method according to the third exemplary embodiment of this disclosure is described with reference to FIGS. 7A to 7C and 9B. In this embodiment, prior to a read operation, program states of relevant memory cells can be determined because the flag data FD is received from the memory controller 690 as described above with reference to FIG. 8B. Accordingly, the flag data FD can be directly checked at step S921 without reading the flag data FD stored in the flag cell.

If, as a result of the check, the flag data FD is '1', threshold voltages of memory cells to be read belong to one of the two states A and B in FIG. 7A. Accordingly, a read operation is performed by using the first reference voltage RD1 as a read voltage at step S922. Data read by the main latch of a relevant page buffer is transferred to the cache latch of the page buffer at step S924 and then externally outputted at step S925.

If, as a result of the check, the flag data is '0', it means that an MSB program operation has been performed, and thus the threshold voltage distributions of memory cells to be read have the same states as shown in FIG. 7B. Accordingly, a read operation is performed by using the second reference voltage RD2 as a read voltage at step S923. Data read by the main latch of a relevant page buffer is transferred to the cache latch of the page buffer at step S924 and then externally outputted at step S925. Accordingly, a value of the read LSB data can be determined.

In the LSB data read operation of the second embodiment, the flag data stored in the flag cell is to be read to be checked using the second reference voltage RD2. If, as a result of the check, the flag data is '1', a read operation based on the first reference voltage RD1 is further performed. That is, if the flag data is '1', the two read operations are to be performed. In the third embodiment, however, the flag data can be directly checked without an additional read operation. Only the read operation based on the first reference voltage RD1 or the second reference voltage RD2 may be performed. In this case, the configuration of the memory system can be simplified because there is no need to have the flag cell for storing the flag data.

Figure 9C:
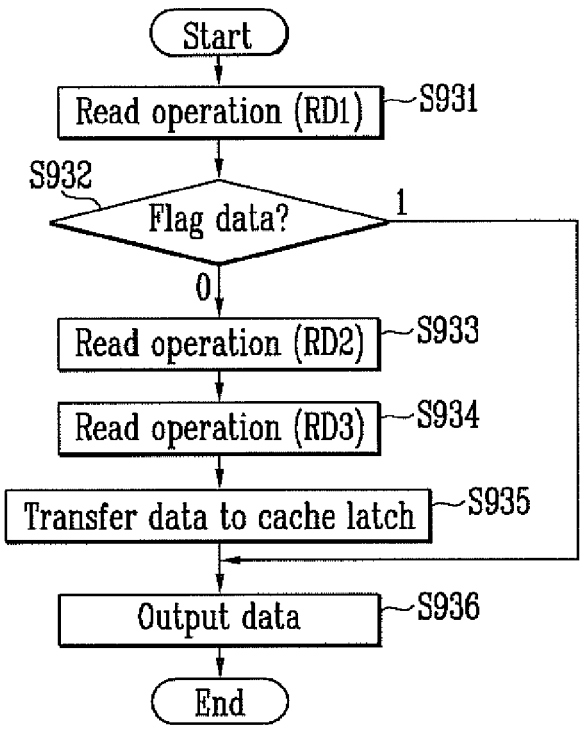
Figure 9D:
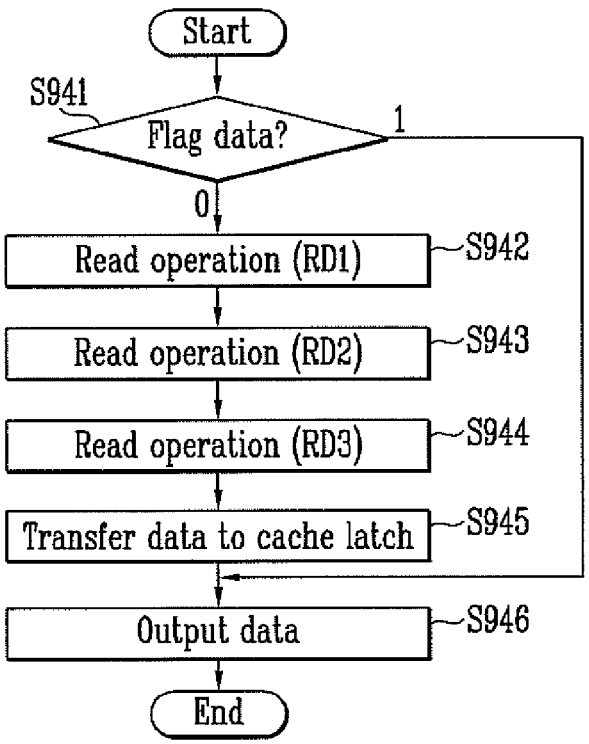

An MSB data read operation of the memory system using the MLC program method is described as follows. FIG. 9C is a diagram illustrating an MSB data read operation in the memory system using the MLC program method according to the second exemplary embodiment of this disclosure. FIG. 9D is a diagram illustrating an MSB data read operation in the memory system using the MLC program method according to the third exemplary embodiment of this disclosure.

The MSB data read operation in the memory system using the MLC program method according to the second exemplary embodiment of this disclosure is described with reference to FIGS. 7A to 7C and 9C. First, in order to determine whether an MSB program operation has been performed, flag data stored in the flag cell is read. The flag data may be read by using the first reference voltage RD1 as a read voltage at step S931. The read flag data is checked at step S932.

If, as a result of the check, the flag data is '0', it means that the MSB program operation has been performed. Referring to FIG. 7B, when the threshold voltages of the memory cells are lower than the first reference voltage RD1, or when the threshold voltages of the memory cells are higher than the second reference voltage RD2 and lower than the third reference voltage RD3, MSB data is '1' (A and C states). When the threshold voltages of the memory cells are higher than the first reference voltage RD1 and smaller than the second reference voltage RD2, or when the threshold voltages of the memory cells are higher than the third reference voltage RD3, the MSB data is '0' (B and D states). Accordingly, when the flag data is '0', a read operation using the second reference voltage RD2 as a read voltage (S933) and a read operation using the third reference voltage RD3 as a read voltage (S934) are sequentially performed. Here, the read operation using the first reference voltage RD1 as a read voltage needs not to be performed because it has already been performed at step S931. Next, data read by the main latch of a relevant page buffer is transferred to the cache latch of the page buffer at step S935 and then externally outputted at step S936.

If, as a result of the check, the flag data is '1', it means that an MSB program operation has not been performed. In this case, threshold voltages of memory cells to be read have the same state as shown in FIG. 7A. Accordingly, the MSB data read operation may be completed by outputting MSB data of '1' at step S936.

The MSB data read operation in the memory system using the MLC program method according to the third exemplary embodiment of this disclosure is described with reference to FIGS. 7A to 7C and 9D. First, the flag data FD received from the memory controller is checked at step S941. In this embodiment, prior to a read operation, program states of relevant memory cells can be determined because the flag data FD is received from the memory controller as described above with reference FIG. 8B. Accordingly, a value of the flag data FD can be directly checked without reading the flag data stored in the flag cell.

If, as a result of the check, the flag data is '0', it means that an MSB program operation has been performed. Thus, a read operation using the first reference voltage RD1 as a read voltage (S942), a read operation using the second reference voltage RD2 as a read voltage (S943), and a read operation using the third reference voltage RD3 as a read voltage (S944) are sequentially performed in order to determine which state threshold voltages of relevant memory cells belong to among the states shown in FIG. 7B. Next, data read by the main latch of a relevant page buffer is transferred to the cache latch of the page buffer at step S945 and then externally outputted at step S946.

If, as a result of the check, the flag data is '1', it means that an MSB program operation has not been performed. Accordingly, the MSB data read operation may be completed by outputting MSB data of '1' at step S946.

Hereinafter, read operations of a memory system using the TLC program method according to the exemplary embodiment of this disclosure are described.

Figure 10A:
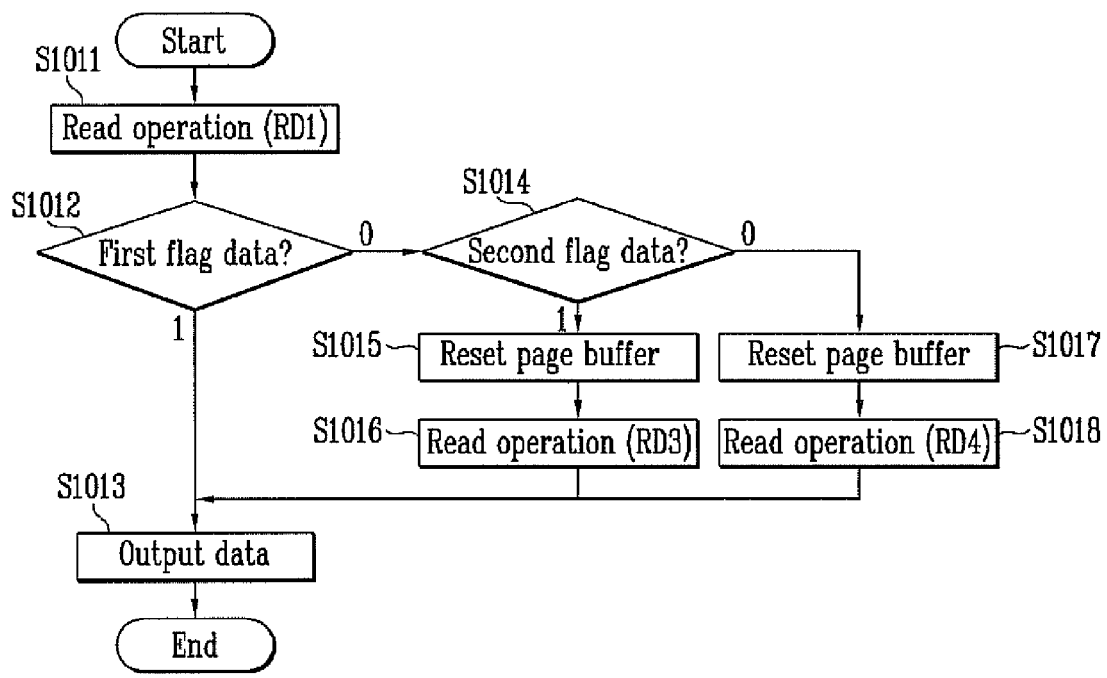
FIGS. 10A, 11A, and 12A are flowcharts illustrating a read operation for the memory system using a TLC program method according to the second exemplary embodiment of this disclosure.
Figure 10B:
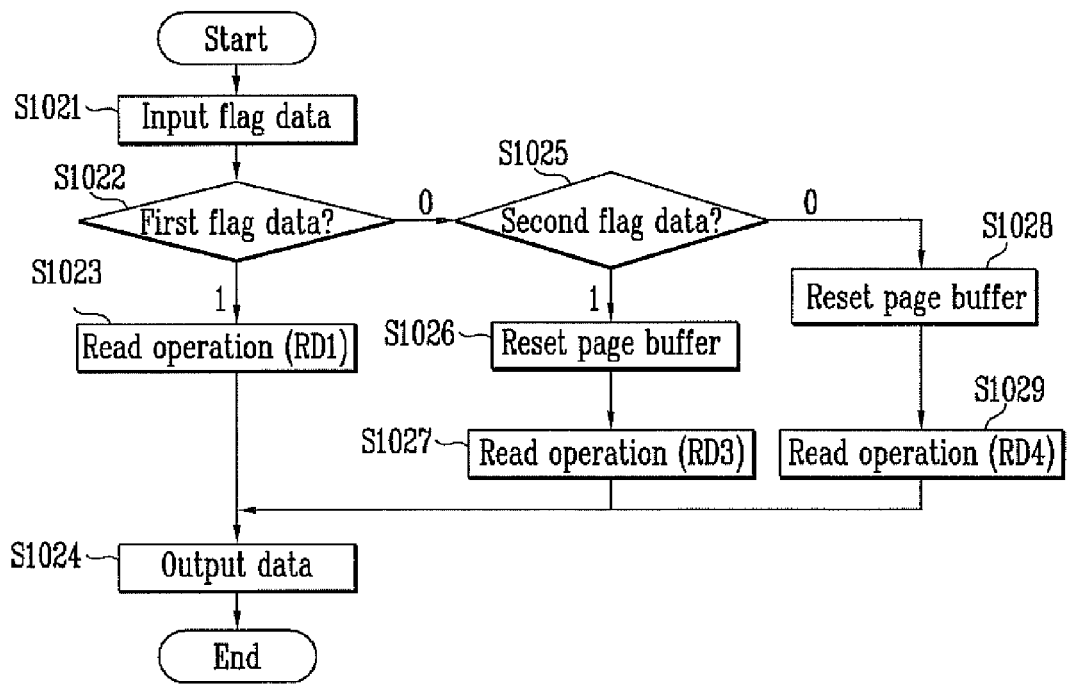
FIGS. 10B, 11B, and 12B are flowcharts illustrating a read operation for the memory system using a TLC program method according to a third exemplary embodiment of this disclosure.
Figure 10C:
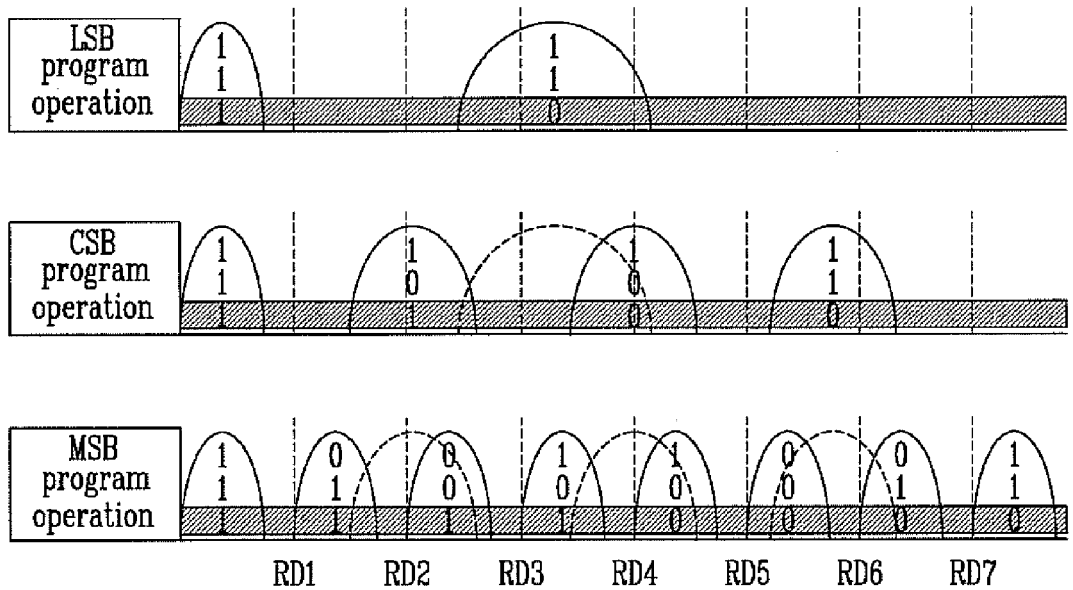
FIGS. 10C, 11C, and 12C are diagrams illustrating threshold voltage distributions of memory cells using the TLC program method.

FIG. 10A is a flowchart illustrating an LSB data read operation of the memory system using the TLC program method according to the second exemplary embodiment of this disclosure. FIG. 10B is a flowchart illustrating an LSB data read operation of the memory system using the TLC program method according to the third exemplary embodiment of this disclosure. FIG. 10C is a diagram illustrating threshold voltage distributions of memory cells in the TLC program method. Meanwhile, FIG. 10D is a diagram illustrating a change in the threshold voltage distributions of a first flag cell and a second flag cell in the TLC program method.

In the TLC program method of storing 3-bit data in a memory cell, two flag cells are used. That is, the first flag cell is used to check whether a CSB program operation for programming an intermediate bit (e.g., medium significant bit) data has been performed, and the second flag cell is used to check whether an MSB program operation for programming an MSB data has been performed.

Figure 10D:
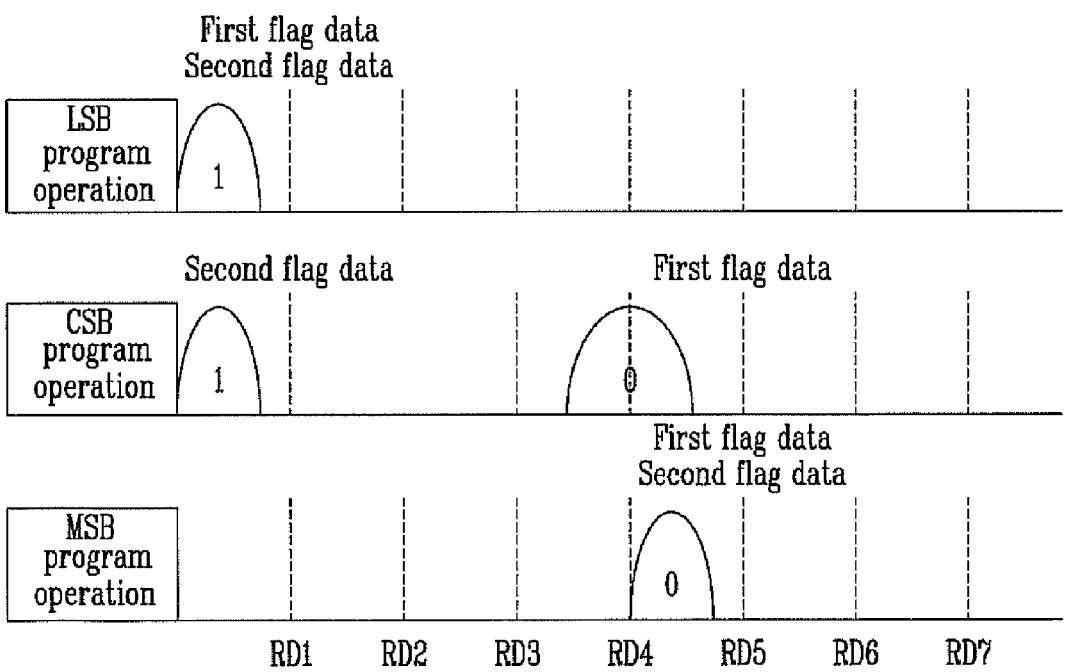
FIG. 10D is a diagram illustrating a change in the threshold voltage distribution of a first flag cell and a second flag cell in the memory system using the TLC program method.

Referring to FIG. 10D, the first flag cell is programmed when the CSB program operation is performed, thus having data '0'. A threshold voltage of the first flag cell may be higher than a third reference voltage RD3 and lower than a fifth reference voltage RD5.

Meanwhile, the second flag cell is programmed when the MSB program operation is performed, thus having data '0'. A threshold voltage of the second flag cell may be higher than a fourth reference voltage RD4 and lower than the fifth reference voltage RD5. The programmed first flag cell may be further programmed when the second flag cell is programmed. Thus, after the MSB program operation is performed, both threshold voltages of the first flag cell and the second flag cell may be higher than the fourth reference voltage RD4 and lower than the fifth reference voltage RD5.

An LSB data read operation in the memory system using the TLC program method according to the second exemplary embodiment of this disclosure is described with reference to FIGS. 10A, 10C, and 10D.

First, in order to check whether a CSB program operation and an MSB program operation have been performed, a read operation using the first reference voltage RD1 as a read voltage is performed at step S1011. It is then checked whether first flag data stored in the first flag cell is '0' or '1' at step S1012. Referring to FIG. 10D, if a threshold voltage of the first flag cell is higher than the first reference voltage RD1, the first flag data is '0'. When the threshold voltage of the first flag cell is lower than the first reference voltage RD1, the first flag data is '1'. If the first flag data is '1', it means that only an LSB program operation has been performed on relevant memory cells to be read. The LSB data read operation may be completed by the read operation using the first reference voltage RD1 as the read voltage at step S1011. When the threshold voltages of the memory cells are lower than the first reference voltage RD1, LSB data is '1'. When the threshold voltages of the memory cells are not lower than the first reference voltage RD1, LSB data is '0'. Accordingly, the data read by a relevant page buffer is externally outputted, and thus the LSB data read operation ends through step S1013.

If, as a result of the check, the first flag data is '0', it means that the CSB program operation has been performed. Thus, it is checked whether the second flag data read by the read operation at step S1011 is '0' or '1' at step S1014. If, as a result of the check, the second flag data is '1', it means that the MSB program operation has not been performed. Referring to FIG. 10C, in threshold voltage distributions of memory cells after the CSB program operation is performed, LSB data has '1' or '0' on the basis of the third reference voltage RD3. When the second flag data is '1', a relevant page buffer is reset at step S1015, a read operation using the third reference voltage RD3 as a read voltage is performed at step S1016. Data read by the read operation is outputted at step S1013.

If, as a result of the check, the second flag data is '0', it means that the MSB program operation has been performed. Referring to FIG. 10C, in threshold voltage distributions of memory cells after the MSB program operation is performed, LSB data has '1' or '0' on the basis of the fourth reference voltage RD4. When the second flag data is '0', the page buffer is reset at step S1017, a read operation using the fourth reference voltage RD4 is performed at step S1018, and data read by the read operation is outputted at step S1013.

The LSB data read operation in the memory system using the TLC program method according to the third exemplary embodiment of this disclosure is described with reference to FIG. 10B.

In this embodiment, first flag data and second flag data are received from the memory controller at step S1021. In this case, a read operation for checking the first flag data and the second flag data needs not to be performed because program states of relevant memory cells can be checked before the read operation is performed. The first flag data is checked at step 1022. If, as a result of the check at step S1022, the first flag data is '1', it means that only an LSB program operation has been performed on the memory cells. In order to determine whether LSB data is '0' or '1', a read operation using the first reference voltage RD1 as a read voltage is performed at step S1023. Next, data read by a relevant page buffer is outputted at step S1024.

If, as a result of the check at step S1022, the first flag data is '0', it means that the CSB program operation has been performed. In order to determine whether an MSB program operation has been performed, the second flag data is checked at step S1025. If, as a result of the check, the second flag data is '1', it means that the MSB program operation has not been performed. The page buffer is reset at step S1026, and a read operation using the third reference voltage RD3 as a read voltage is performed at step S1027. Referring to FIG. 10C, LSB data has '0' or '1' on the basis of third reference voltage RD3 after the CSB program operation is performed. Thus, the read operation using the third reference voltage RD3 as the read voltage is performed. When data read by the page buffer is outputted at step S1024, the LSB data read operation may be completed.

If, as a result of the check at step S1025, the second flag data is '0', it means that the MSB program operation has been performed. The page buffer is reset at step S1028, and a read operation using the fourth reference voltage RD4 as a read voltage is performed at step S1029. Referring to FIG. 10C, after the MSB program operation is performed, LSB data has '0' or '1' on the basis of the fourth reference voltage RD4. The LSB data may be read by performing the read operation using the fourth reference voltage RD4 as the read voltage. When data read by the page buffer is outputted at step S1024, the LSB data read operation may be completed.

In the LSB data read operation of the memory system according to the second exemplary embodiment of this disclosure, one read operation may be performed if only the LSB program operation has been performed, twice read operations may be performed if the CSB program operation has been performed, and twice read operations may be performed if up to the MSB program operation has been performed. However, in the LSB data read operation of the memory system according to the third exemplary embodiment of this disclosure, LSB data can be outputted by only one read operation anytime when only the LSB program operation is performed, the CSB program operation has been performed, or up to the MSB program operation has been performed, because the read operation for checking flag data needs not to be performed. Accordingly, efficiency of the read operation can be increased, and a design of a semiconductor memory system can be simplified because there is no need to have a flag cell for storing flag data.

Figure 11A:
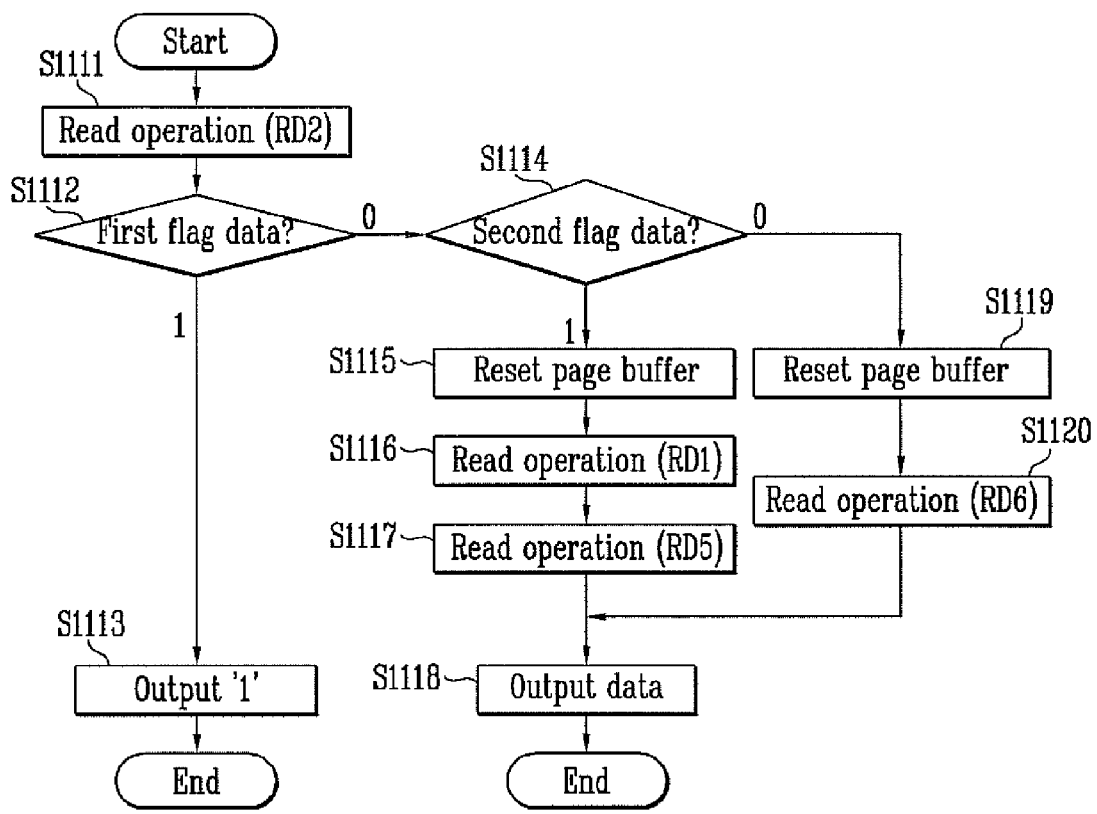
Figure 11B:
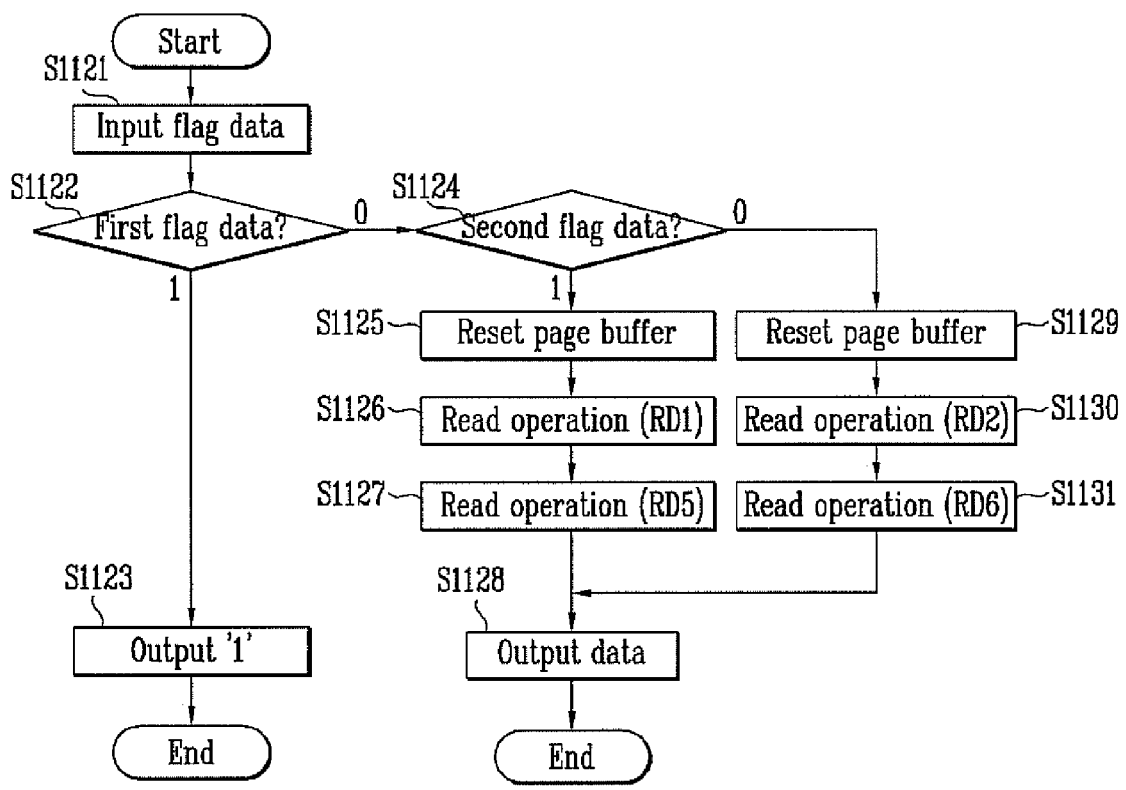
Figure 11C:
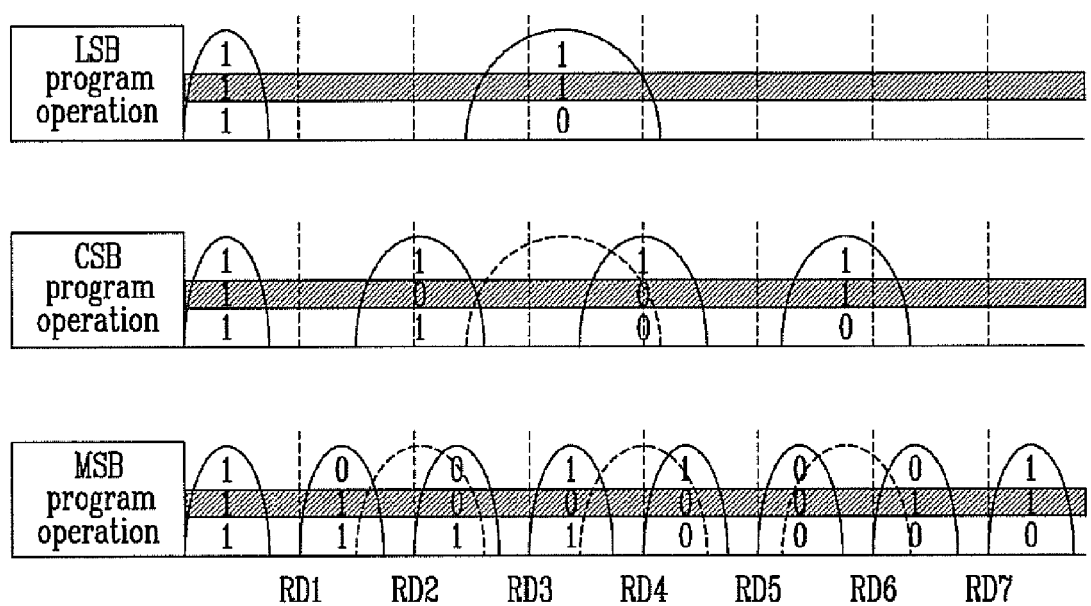

Methods of performing a CSB data read operation in the memory system using the TLC program method is described with reference to FIGS. 11A to 11C. FIG. 11A is a flowchart illustrating a method of performing a CSB data read operation in the memory system using the TLC program method according to a second exemplary embodiment of this disclosure. FIG. 11B is a flowchart illustrating a method of performing a CSB data read operation in the memory system using the TLC program method according to a third exemplary embodiment of this disclosure. Meanwhile, FIG. 11C is a diagram illustrating threshold voltage distributions of memory cells in the TLC program method.

Referring to FIG. 11A, in the CSB data read operation according to the second exemplary embodiment of this disclosure, in order to check first flag data and second flag data stored in a first flag cell and a second flag cell, a read operation using a second reference voltage RD2 as a read voltage is performed at step S1111. Next, the first flag data read by the read operation at step S1111 is checked at step S1112. If, as a result of the check, the first flag data is '1', it means that only an LSB program operation has been performed on relevant memory cells to be read. Accordingly, the CSB data read operation may be completed by outputting CSB data of '1' at step S1113.

If, as a result of the check, the first flag data is '0', it means that a CSB program has been performed on the memory cells. Thus, the second flag data read by the read operation at step S1111 is checked at step S1114. If, as a result of the check at step S1114, the second flag data is '1', it means that an MSB program operation has not been performed. Referring to FIG. 11C, when the threshold voltages of the memory cells are lower than a first reference voltage RD1 or when the threshold voltages of the memory cells are higher than a fifth reference voltage RD5 after the CSB program operation is performed, it means that CSB data is '1'. When the threshold voltages of the memory cells are higher than the first reference voltage RD1 and lower than the fifth reference voltage RD5, it means that the CSB data is '0'. Accordingly, a relevant page buffer is reset at step S1115, and a read operation using the first reference voltage RD1 as a read voltage (S1116) and a read operation using the fifth reference voltage RD5 as a read voltage (S1117) are sequentially performed. Next, the CSB data read operation may be completed by outputting data read by the page buffer at step S1118.

If, as a result of the check at step S1114, the second flag data is '0', it means that an MSB program operation has been performed. Referring to FIG. 11C, when the threshold voltage of the memory cells are lower than the second reference voltage RD2 or when the threshold voltage of the memory cells are higher than a sixth reference voltage RD6 after the MSB program operation is performed, it means that CSB data is '1'. When the threshold voltage of the memory cells is higher than the second reference voltage RD2 and lower than the sixth reference voltage RD6, it means that the CSB data is '0'. Accordingly, the page buffer is reset at step S1119, and a read operation using the sixth reference voltage RD6 as a read voltage at step S1120. Next, the CSB data read operation may be completed by outputting data read by the page buffer at step S1118. Here, a read operation using the second reference voltage RD2 as a read voltage needs not to be performed again because it has already been performed at step S1111.

The CSB data read operation of the memory system using the TLC program method according to the third exemplary embodiment of this disclosure is described with reference to FIGS. 11B and 11C. In this embodiment, first flag data and second flag data are received from the memory controller at step S1121. In this case, a read operation for checking the first flag data and the second flag data needs not to be performed because the first flag data and the second flag data can be checked before a read operation is performed. The first flag data is checked at step S1122. If, as a result of the check, the first flag data is '1', it means that a CSB program operation has not been performed. Thus, the CSB read operation may be completed by outputting CSB data of '1' at step S1123 because the CSB data is always '1'.

If, as a result of the check at step S1122, the first flag data is '0', it means that the CSB program has been performed. Next, the second flag data is checked at step S1124. If, as a result of the check at step S1124, the second flag data is '1', it means that an MSB program operation has not been performed. In this case, as shown in FIG. 11A, a relevant page buffer is reset at step S1125, and a read operation using the first reference voltage RD1 as a read voltage (S1126) and a read operation using the fifth reference voltage RD5 as a read voltage (S1127) are sequentially performed. Next, the CSB data read operation may be completed by outputting data read by the page buffer at step S1128.

If, as a result of the check at step S1124, the second flag data is '0', it means that the MSB program operation has been performed. Referring to FIG. 11C, when the threshold voltages of the memory cells are lower than the second reference voltage RD2 or when the threshold voltages of the memory cells are higher than the sixth reference voltage RD6 after the MSB program operation is performed, it means that CSB data is '1'. When the threshold voltages of the memory cells are higher than the second reference voltage RD2 and lower than the sixth reference voltage RD6, it means that the CSB data is '0'. Accordingly, the page buffer is reset at step S1129, and a read operation using the second reference voltage RD2 as a read voltage (S1130) and a read operation using the sixth reference voltage RD6 as a read voltage (S1131) are sequentially performed. Next, the CSB data read operation may be completed by outputting data read by the page buffer at step S1128.

In the CSB data read operation of the memory system according to the second exemplary embodiment of this disclosure, one read operation may be performed if only the LSB program operation has been performed, three read operations may be performed if the CSB program operation has been performed, and twice read operations may be performed if up to the MSB program operation has been performed. In the CSB data read operation of the memory system according to the third exemplary embodiment of this disclosure, however, the read operation for checking flag data needs not to be performed. Accordingly, if only the LSB program operation has been performed, the read operation for checking flag data needs not to be performed. CSB data can be outputted by performing two read operations if the CSB program operation has been performed and performing at least two read operations if up to the MSB program operation has been performed. Accordingly, in the case where only the LSB program operation and the CSB program operation are performed, efficiency of the read operation can be increased because one less read operation is performed as compared with the second exemplary embodiment.

Figure 12A:
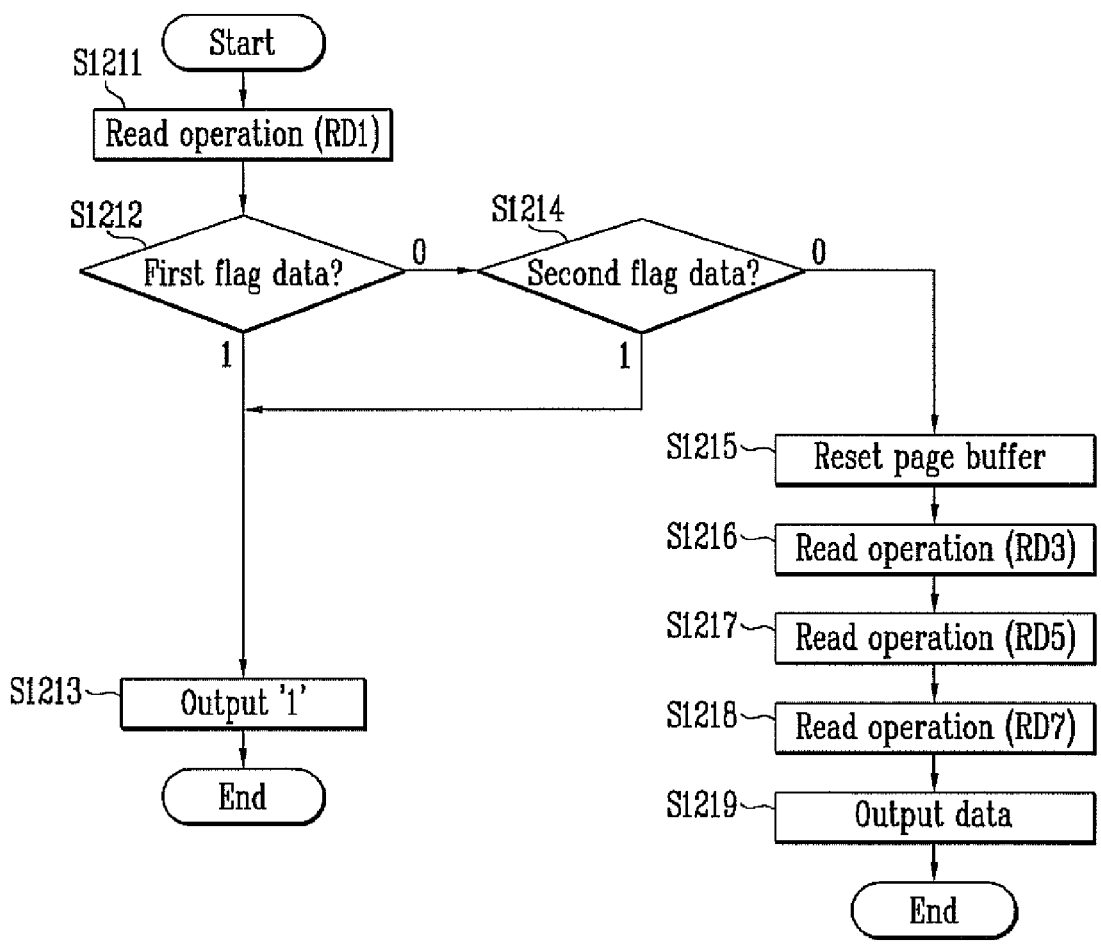
Figure 12B:
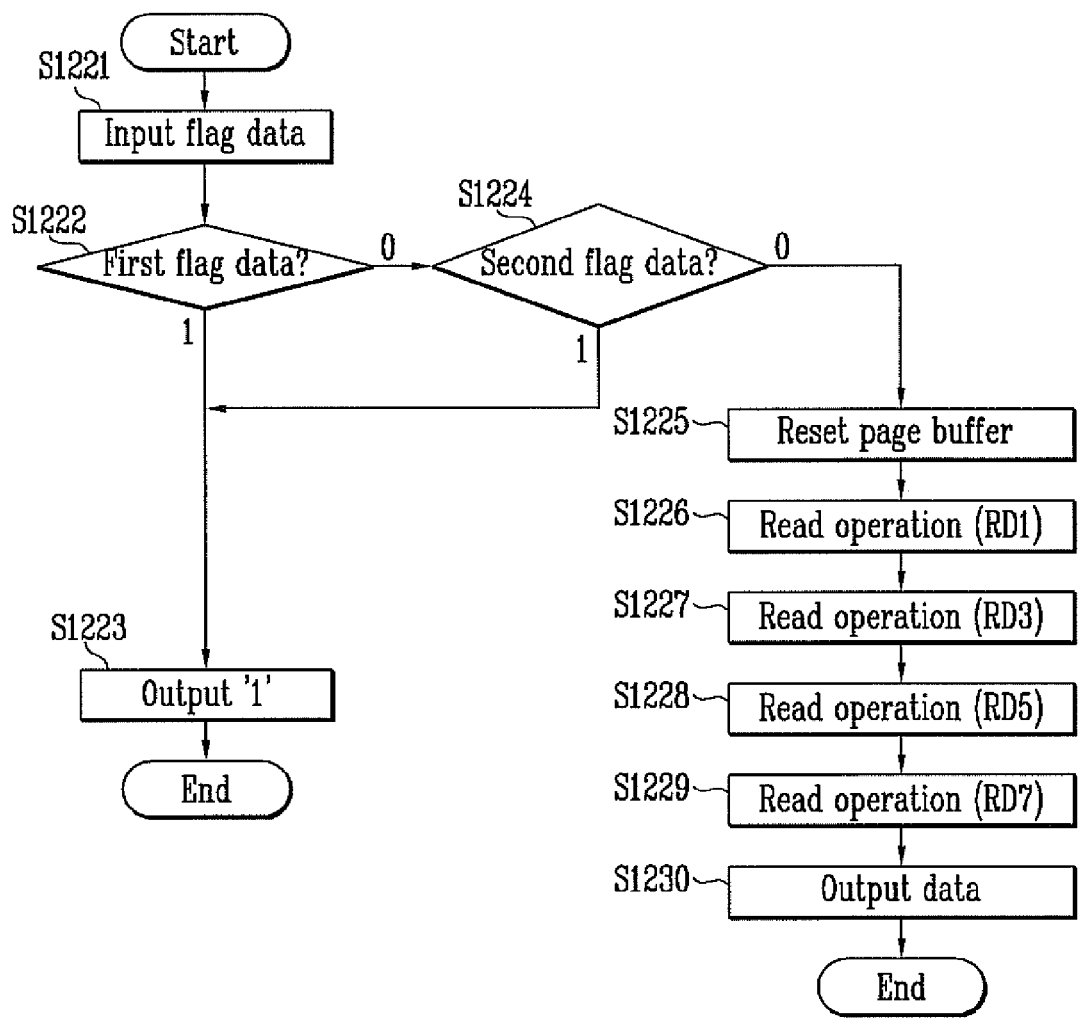
Figure 12C:
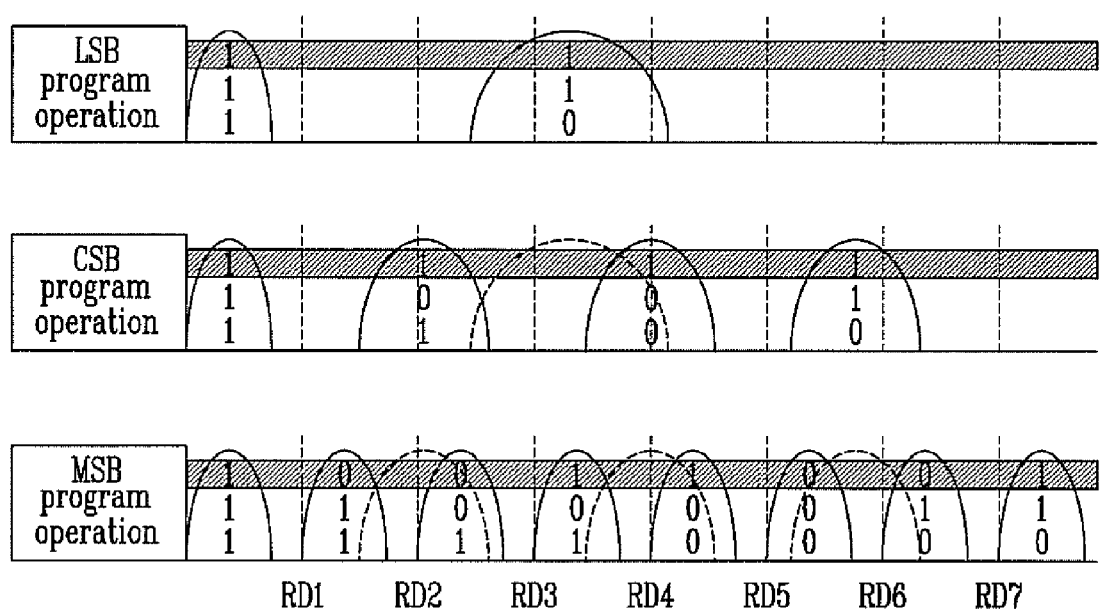

An MSB data read operation in the memory system using the TLC program method is described with reference to FIGS. 12A to 12C. FIG. 12A is a flowchart illustrating an MSB data read operation in the memory system of the TLC program method according to a second exemplary embodiment of this disclosure. FIG. 12B is a flowchart illustrating an MSB data read operation in the memory system of the TLC program method according to a third exemplary embodiment of this disclosure. Meanwhile, FIG. 12C is a diagram illustrating threshold voltage distributions of memory cells in the TLC program method.

Referring to FIG. 12A, in the MSB data read operation according to the second exemplary embodiment of this disclosure, in order to check first flag data and second flag data stored in a first flag cell and a second flag cell, a read operation using a first reference voltage RD1 as a read voltage is performed at step S1211. Next, the first flag data ready by the read operation is checked at step S1212. If, as a result of the check, the first flag data is '1', it means that only an LSB program operation has been performed on memory cells to be read. Accordingly, MSB data of '1' may be outputted at step S1213 because the MSB data is always '1'.

If, as a result of the check, the first flag data is '0', it means that a CSB program operation has been performed. The second flag data read by the read operation at step S1211 is checked at step S1214. If, as a result of the check at step S1214, the second flag data is '1', it means that an MSB program operation has not been performed. Accordingly, MSB data of '1' may be outputted at step S1213 because the MSB data is always '1'.

If, as a result of the check at step S1214, the second flag data is '0', it means that an MSB program operation has been performed. Referring to FIG. 12C, when the threshold voltages of the memory cells are lower than the first reference voltage RD1, when the threshold voltages of the memory cells are higher than a third reference voltage RD3 and lower than a fifth reference voltage RD5, or when the threshold voltages of the memory cells are higher than a seventh reference voltage RD7, it means that MSB data is '1'. When the threshold voltages of the memory cells are higher than the first reference voltage RD1 and lower than the third reference voltage RD3 or when the threshold voltages of the memory cells are higher than the fifth reference voltage RD5 and lower than the seventh reference voltage RD7, it means that the MSB data is '0'. Accordingly, a relevant page buffer is reset at step S1215, and a read operation using the third reference voltage RD3 as a read voltage (S1216), a read operation using the fifth reference voltage RD5 as a read voltage (S1217), and a read operation using the seventh reference voltage RD7 as a read voltage (S1218) are sequentially performed. Next, the MSB data read operation may be completed by outputting data read by the page buffer at step S1219. Here, a read operation using the first reference voltage RD1 as a read voltage needs not to be performed again because it has already been performed at step S1211.

A MSB data read operation in the memory system using the TLC program method according to the third exemplary embodiment of this disclosure is described with reference to FIGS. 12B and 12C.

In this embodiment, first flag data and second flag data are received from the memory controller at step S1221. Accordingly, a read operation for checking the first flag data and the second flag data needs not to be performed. The first flag data is checked at step S1222. If, as a result of the check, the first flag data is '1', it means that a CSB program operation has not been performed. The MSB data read operation may be completed by outputting MSB data of '1' at step S1223 because the MSB data is always '1'.

If, as a result of the check, the first flag data is '0', it means that a CSB program has been performed. The second flag data is checked at step S1224. If, as a result of the check at S1224, the second flag data is '1', it means that the MSB program operation has not been performed. In this case, the MSB data read operation may be completed by outputting MSB data of '1' at step S1223 because the MSB data is always '1'.

If, as a result of the check at S1224, the second flag data is '0', a relevant page buffer is reset at step S1225. Next, a read operation using the first reference voltage RD1 as a read voltage (S1226), a read operation using the third reference voltage RD3 as a read voltage (S1227), a read operation using the fifth reference voltage RD5 as a read voltage (S1228), and a read operation using the seventh reference voltage RD7 as a read voltage (S1229) are sequentially performed. Next, the MSB read operation may be completed by outputting data read by the page buffer at step S1230.

In the MSB data read operation of the memory system according to the second exemplary embodiment of this disclosure, if only the LSB program operation has been performed or the CSB program operation has been performed, one read operation may be performed. If up to the MSB program operation has been performed, four read operations may be performed. In the MSB data read operation of the memory system according to the third exemplary embodiment of this disclosure, however, a read operation for checking flag data needs not to be performed. Accordingly, if the LSB program operation has been performed or the CSB program operation has been performed, the read operation needs not to be performed. Furthermore, if up to the MSB program operation has been performed, four read operations are performed. Accordingly, in the case where only the LSB program operation is performed or the CSB program operation is performed, efficiency of the read operation can be increased as compared with the method according to the second exemplary embodiment of this disclosure because one less read operation is performed.

According to the embodiments of this disclosure, a level of voltage used for an operation is determined, and voltage of a determined level is supplied. Accordingly, the operating speed can be increased.

What is claimed is:

1. A memory system, comprising:
a flash memory device comprising a first memory block group on which a least significant bit (LSB) program operation has been performed and a program operation on another bit has not been performed and a second memory block group on which both the LSB program operation and an MSB program operation have been performed; and
a memory controller configured to check that a memory block selected for an LSB data read operation belongs to which of the first and second memory block groups, based on an address signal of the selected memory block and set a level of a read voltage for the LSB data read operation of the selected memory block,
wherein the flash memory device is configured to output a LSB data by the LSB data read operation using the read voltage set by the memory controller before the LSB data read operation.

2. The memory system of claim 1, wherein the memory controller comprises a register configured to store memory state information, including program state information about memory blocks included in the first and the second memory block groups, and is configured to check which of the groups the selected memory block belongs to based on the memory state information stored in the register before the LSB data read operation is performed.

3. The memory system of claim 2, wherein the memory controller is configured to store the memory state information in the register when power is initially supplied to the flash memory device.

4. The memory system of claim 1, wherein the memory controller is configured to output a read command signal, the address signal, and a read voltage setting signal to the flash memory device for the LSB data read operation.

5. The memory system of claim 1, wherein: when the selected memory block belongs to the first memory block group, the memory controller is configured to output a first level of a first read voltage setting signal for setting the read voltage to the flash memory device; and when the selected memory block belongs to the second memory block group, the memory controller is configured to output a second read voltage setting signal of a second level higher than the first level for setting the read voltage to the flash memory device.

6. The memory system of claim 1, wherein the memory controller is configured to check which of the groups the selected memory block belongs to again, based on data read from the select memory block by the LSB data read operation.

7. The memory system of claim 6, wherein after the LSB data read operation for the selected memory block is performed using the read voltage of a first level, if the selected memory block is determined to belong to the second memory block group, the flash memory device is configured to perform the LSB data read operation for the selected memory block using the read voltage of a second level higher than the first level.

8. The memory system of claim 6, wherein after the LSB data read operation for the selected memory block is performed using the read voltage of a second level, if the selected memory block is determined to belong to the first memory block group, the flash memory device is configured to perform the LSB data read operation for the selected memory block using the read voltage of a first level lower than the second level.

9. The memory system of claim 1, wherein after the memory controller stores memory state information about which of the first and second memory block groups a memory block included in the flash device belongs to, if a program operation for the memory block is performed, the memory controller updates the memory state information.

10. A method of operating a memory system, comprising:
storing memory state information for checking a first memory block group on which a least significant bit (LSB) program operation has been performed and a program operation on another bit has not been performed and a second memory block group on which both the LSB program operation and a most significant bit (MSB) program operation have been performed in a register;
checking whether a memory block selected based on an address signal belongs to the first memory block group or the second memory block group based on the memory state information in response to an LSB read command signal and the address signal;
setting a read voltage for an LSB data read operation to a first level and performing the LSB data read operation for the selected memory block using the read voltage of the first level when the selected memory block belongs to the first memory block group; and
setting the read voltage to a second level higher than the first level and performing the LSB data read operation for the selected memory block using the read voltage of the second level when the selected memory block belongs to the second memory block group.

11. The method of claim 10, wherein the memory state information is stored in the register when power starts being supplied to the first and second memory block groups.

12. The method of claim 10, further comprising, after the performing of the LSB data read operation using the read voltage of the first level: checking whether the selected memory block belongs to the first memory block group or the second memory block group again based on data read from the selected memory block by the LSB data read operation; outputting the read data if the selected memory block belongs to the first memory block group from a result of the checking; and performing the LSB data read operation for the selected memory block using the read voltage of the second level if the selected memory block belongs to the second memory block group from a result of the checking.

13. The method of claim 10, further comprising, after the performing of the LSB data read operation using the read voltage of the second level: checking whether the selected memory block belongs to the first memory block group or the second memory block group again based on data read from the selected memory block by the LSB data read operation; outputting the read data if the selected memory block belongs to the second memory block group from a result of the checking; and performing the LSB data read operation for the selected memory block using the read voltage of the first level if the selected memory block belongs to the first memory block group from a result of the checking.

14. The method of claim 10, further comprising, after the storing of the memory state information in the register: performing a program operation for a memory block; checking whether the memory block on which the program operation has been performed belongs to the first memory block group or the second memory block group; and updating memory state information about a memory block group including the memory block on which the program operation has been performed among the first and second memory block groups.

15. A memory system, comprising:
a nonvolatile memory device comprising a first memory cell block group on which a least significant bit (LSB) program operation has been performed and a program operation on another bit has not been performed, a second memory cell block group on which both the LSB program operation and a medium significant bit program operation have been performed, and a third memory cell block group all the LSB program operation, the medium significant bit program operation, and a most significant bit (MSB) program operation have been performed; and
a memory controller configured to check which of the first to third memory block groups a memory cell block selected based on an address signal belongs to and set levels of read voltages for at least one of an LSB data read operation, a medium significant bit data read operation, and an MSB data read operation of the selected memory cell block in response to a result of the check.

16. The memory system of claim 15, wherein the memory controller is configured to output the result of the check, together with the address signal, to the nonvolatile memory device in a flag data form.

17. The memory system of claim 16, wherein the address signal is inputted to the nonvolatile memory device during a plurality of clock cycles, and the result of the check in the flag data form is inputted to the nonvolatile memory device after the address signal is inputted.

18. The memory system of claim 16, wherein the address signal is inputted to the nonvolatile memory device during a plurality of clock cycles, and the result of the check in the flag data form is inputted to the nonvolatile memory device at an empty bit within the cycles.

19. The memory system of claim 15, wherein the memory controller is configured to check which of the groups the selected memory cell block belongs to using a mapping table stored in the nonvolatile memory device.

20. The memory system of claim 19, wherein the nonvolatile memory device further comprises a CAM block in which the mapping table is stored.

21. The memory system of claim 19, wherein the memory controller is configured to store the mapping table, outputted from the nonvolatile memory device, when power starts being supplied to the nonvolatile memory device.

22. The memory system of claim 15, wherein the medium significant bit data read operation is performed when the selected memory block belongs to the second or third memory block group.

23. The memory system of claim 15, wherein the MSB data read operation is performed when the selected memory block belongs to the third memory block group.

24. A method of operating a memory system, comprising:
checking which group a memory cell block selected based on an address signal belongs to, among a first memory cell block group on which a least significant bit (LSB) program operation has been performed and a program operation on another bit has not been performed, a second memory cell block group on which the LSB program operation and a medium significant bit program operation have been performed, and a third memory cell block group on which all the LSB program operation, the medium significant bit program operation, and a most significant bit (MSB) program operation have been performed; and
setting levels of read voltages for at least one of an LSB data read operation, a medium significant bit data read operation, and an MSB data read operation of the selected memory cell block in response to a result of the checking.

25. The method of claim 24, wherein checking which group the selected memory cell block belongs to is performed with reference to a mapping table.

* * * * *